United States Patent
Lee et al.

(10) Patent No.: US 7,577,034 B2
(45) Date of Patent: Aug. 18, 2009

(54) REDUCING PROGRAMMING VOLTAGE DIFFERENTIAL NONLINEARITY IN NON-VOLATILE STORAGE

(75) Inventors: Dana Lee, Saratoga, CA (US); Jun Wan, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 139 days.

(21) Appl. No.: 11/861,909

(22) Filed: Sep. 26, 2007

(65) Prior Publication Data

US 2009/0080263 A1 Mar. 26, 2009

(51) Int. Cl.
G11C 11/34 (2006.01)

(52) U.S. Cl. .............................. 365/185.19; 365/185.18

(58) Field of Classification Search ............. 365/185.19, 365/185.22
See application file for complete search history.

(56) References Cited

U.S. PATENT DOCUMENTS

| | | | |
|---|---|---|---|
| 5,386,422 A | 1/1995 | Endoh et al. | |
| 5,570,315 A | 10/1996 | Tanaka et al. | |
| 5,774,397 A | 6/1998 | Endoh et al. | |
| 6,046,935 A | 4/2000 | Takeuchi et al. | |
| 6,222,762 B1 | 4/2001 | Guterman et al. | |
| 6,301,151 B1 | 10/2001 | Engh et al. | |
| 6,304,487 B1 | 10/2001 | Pawletko et al. | |
| 6,307,490 B1 | 10/2001 | Litfin et al. | |
| 6,327,183 B1 | 12/2001 | Pawletko et al. | |
| 6,343,033 B1 | 1/2002 | Parker | |
| 6,433,714 B1 | 8/2002 | Clapp et al. | |
| 6,456,528 B1 | 9/2002 | Chen | |
| 6,522,580 B2 | 2/2003 | Chen et al. | |
| 6,859,397 B2 | 2/2005 | Lutze et al. | |
| 6,937,521 B2 | 8/2005 | Avni et al. | |
| 7,009,887 B1 | 3/2006 | Hsia et al. | |
| 7,023,736 B2 | 4/2006 | Cernea et al. | |
| 7,046,568 B2 | 5/2006 | Cernea | |
| 7,054,193 B1 | 5/2006 | Wong | |
| 7,085,341 B2 | 8/2006 | Wells | |
| 7,173,859 B2 | 2/2007 | Hemink | |
| 7,196,931 B2 | 3/2007 | Cernea et al. | |
| 7,254,071 B2 | 8/2007 | Tu et al. | |

(Continued)

OTHER PUBLICATIONS

Geiger, Allen and Strader, "VLSI Design Techniques for Analog and Digital Circuits," Chapter 8, Analog Systems 1990.

*Primary Examiner*—Son Dinh
(74) *Attorney, Agent, or Firm*—Vierra Magen Marcus & DeNiro LLP

(57) ABSTRACT

A corrective action is taken to adjust for nonlinearities in a program voltage which is applied to a selected word line in a memory device. The nonlinearities result in a non-uniform program voltage step size which can cause over programming or slow programming. A digital to analog converter (DAC) which provides the program voltages can have a nonlinear output, such as when certain code words are input to the DAC. The memory device can be tested beforehand to determine where the nonlinearities occur, and configured to take corrective action when the corresponding code words are input. For example, the DAC may have a nonlinear output when a roll-over code word is input, e.g., a when a string of least significant bits in successive code words change from 1's to 0's. The corrective action can include repeating a prior program pulse or adjusting a duration of a program pulse.

48 Claims, 19 Drawing Sheets

U.S. PATENT DOCUMENTS

| | | | |
|---|---|---|---|
| 7,355,892 B2* | 4/2008 | Hemink | 365/185.22 |
| 2004/0255090 A1 | 12/2004 | Guterman et al. | |
| 2005/0024939 A1 | 2/2005 | Chen et al. | |
| 2006/0126390 A1 | 6/2006 | Gorobets et al. | |
| 2006/0140007 A1 | 6/2006 | Cernea et al. | |
| 2006/0158947 A1 | 7/2006 | Chan et al. | |
| 2006/0221692 A1 | 10/2006 | Chen | |
| 2007/0159891 A1 | 7/2007 | Tu et al. | |
| 2008/0002468 A1* | 1/2008 | Hemink | 365/185.17 |

* cited by examiner

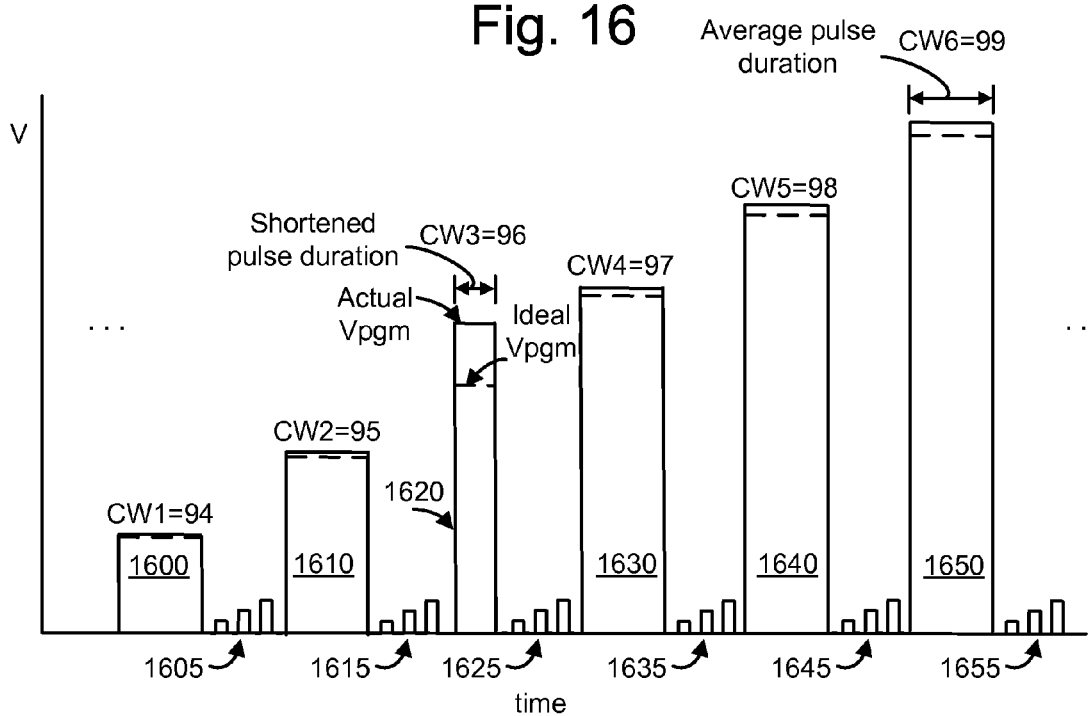
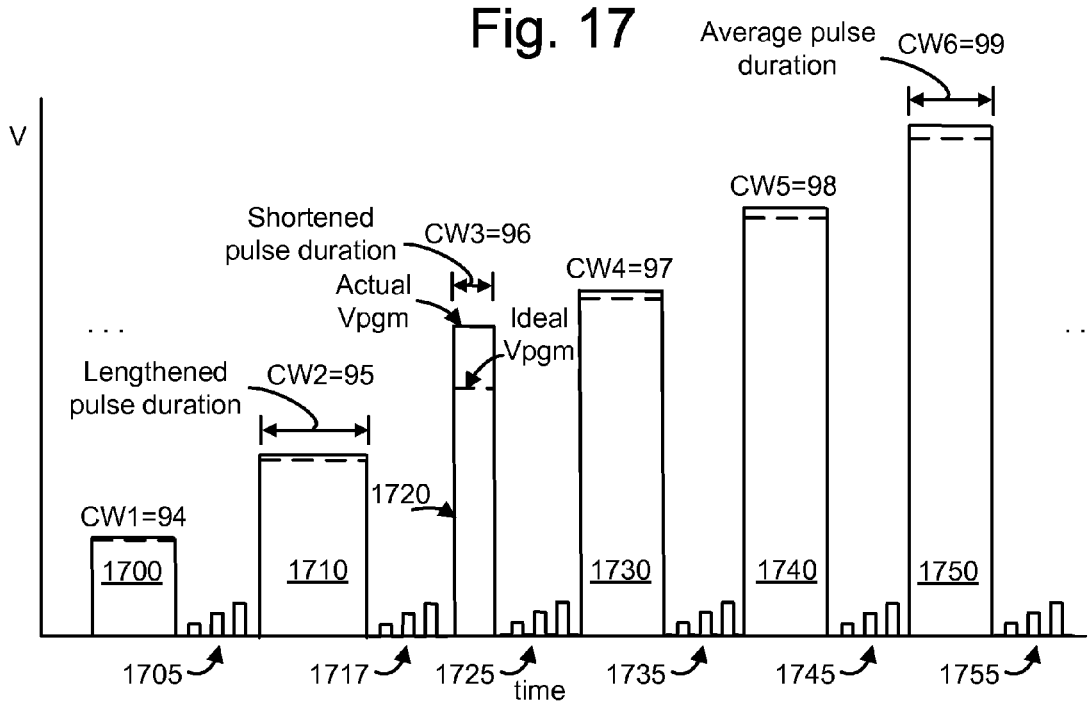

REDUCING PROGRAMMING VOLTAGE DIFFERENTIAL NONLINEARITY IN NON-VOLATILE STORAGE

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

However, maintaining precise control of the program voltage can be problematic.

SUMMARY OF THE INVENTION

The present invention provides a method and apparatus for correcting nonlinearities in program voltage in a memory device.

In one embodiment, a method for operating a non-volatile storage system includes providing a series of program voltage pulses to at least one non-volatile storage element in a set of non-volatile storage elements, where a digital-to-analog converter is used to provide the series of program voltage pulses in response to code words which are input to the digital-to-analog converter according to a code word sequence. The method further includes determining when a particular code word which has a threshold number of rollover bits is reached in the code word sequence.

In another embodiment, a method for operating a non-volatile storage system includes observing a correspondence between voltages provided by a digital-to-analog converter and code words input to the digital-to-analog converter, determining at least one code word for which the correspondence is non-linear, and providing a series of program voltage pulses to at least one storage element in a set of storage elements using the digital-to-analog converter, where the digital-to-analog converter is used to provide the series of program voltage pulses in response to the code words which are input to the digital-to-analog converter in a code word sequence. The method further includes determining when the at least one code word is reached in the code word sequence.

In another embodiment, a method for operating a non-volatile storage system includes determining a differential non-linearity of a digital-to-analog converter, providing a series of program voltage pulses to at least one non-volatile storage element in a set of non-volatile storage elements using the digital-to-analog converter, and adjusting, relative to other program voltage pulses in the series, at least one of the program voltage pulses which is associated with the differential non-linearity.

In another embodiment, a method for operating a non-volatile storage system includes observing a correspondence between voltages provided by a digital-to-analog converter and code words input to the digital-to-analog converter, determining at least one code word for which the correspondence is non-linear, providing a series of program voltage pulses to at least one non-volatile storage element in a set of non-volatile storage elements using the digital-to-analog converter and adjusting a programming speed of the at least one non-volatile storage element when the at least one code word is input to the digital-to-analog converter.

In another embodiment, a non-volatile storage system includes a set of non-volatile storage elements, a digital-to-analog converter which provide a series of program voltage pulses to at least one non-volatile storage element in the set of non-volatile storage elements in response to code words which are input to the digital-to-analog converter according to a code word sequence, and at least one control circuit in communication with the set of non-volatile storage elements and the digital-to-analog converter. The at least one control circuit determines when a particular code word which has a threshold number of rollover bits is reached in the code word sequence.

In another embodiment, a non-volatile storage system includes a set of non-volatile storage elements, a digital-to-analog converter, and at least one control circuit in communication with the set of non-volatile storage elements and the digital-to-analog converter. The at least one control circuit: a) observes a correspondence between voltages provided by the digital-to-analog converter and code words input to the digital-to-analog converter, b) determines at least one code word for which the correspondence is non-linear, c) provides a series of program voltage pulses to at least one storage element in the set of non-volatile storage elements using the digital-to-analog converter, the digital-to-analog converter is used to provide the series of program voltage pulses in response to the code words, which are input to the digital-to-analog converter in a code word sequence, and d) determines when the at least one code word is reached in the code word sequence.

In another embodiment, a non-volatile storage system includes a set of non-volatile storage elements, a digital-to-analog converter, and at least one control circuit in communication with the set of non-volatile storage elements and the digital-to-analog converter. The at least one control circuit determines a differential non-linearity of the digital-to-analog converter, provides a series of program voltage pulses to at least one non-volatile storage element in the set of non-volatile storage elements using the digital-to-analog converter, and adjusts, relative to other program voltage pulses in the series, at least one of the program voltage pulses which is associated with the differential non-linearity.

In another embodiment, a non-volatile storage system includes a set of non-volatile storage elements, a digital-to-analog converter, and at least one control circuit in communication with the set of non-volatile storage elements and the digital-to-analog converter. The at least one control circuit: a) observes a correspondence between voltages provided by a digital-to-analog converter and code words input to the digital-to-analog converter, b) determines at least one code word for which the correspondence is non-linear, c) provides a series of program voltage pulses to at least one non-volatile storage element in a set of non-volatile storage elements using the digital-to-analog converter, and d) adjusts a programming speed of the at least one non-volatile storage element when the at least one code word is input to the digital-to-analog converter.

BRIEF DESCRIPTION OF THE DRAWINGS

FIG. 16 depicts a time series of program voltages and verify voltages applied to a selected word line, where a duration of a program pulse is adjusted.

FIG. 17 depicts a time series of program voltages and verify voltages applied to a selected word line, where a duration of a selected program pulse is shortened and a duration of a prior program pulse is lengthened.

DETAILED DESCRIPTION

The present invention provides a method and apparatus for correcting nonlinearities in program voltage in a memory device.

Figure 1:
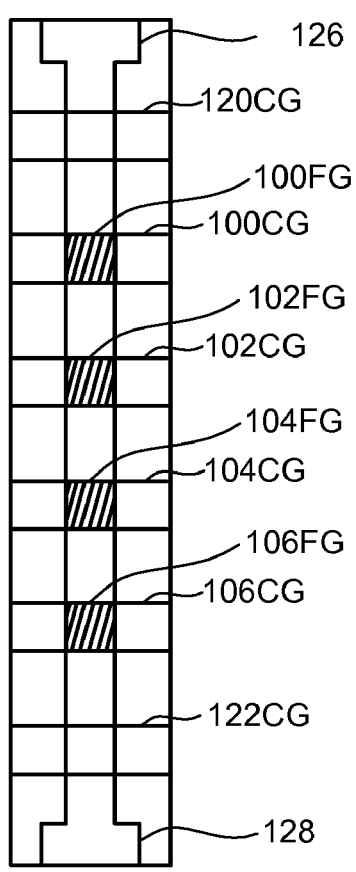
FIG. 1 is a top view of a NAND string.
Figure 2:
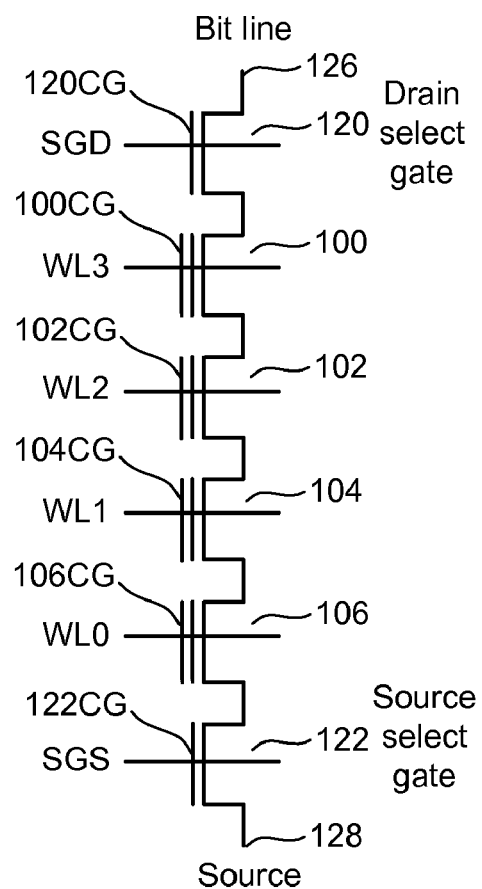
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
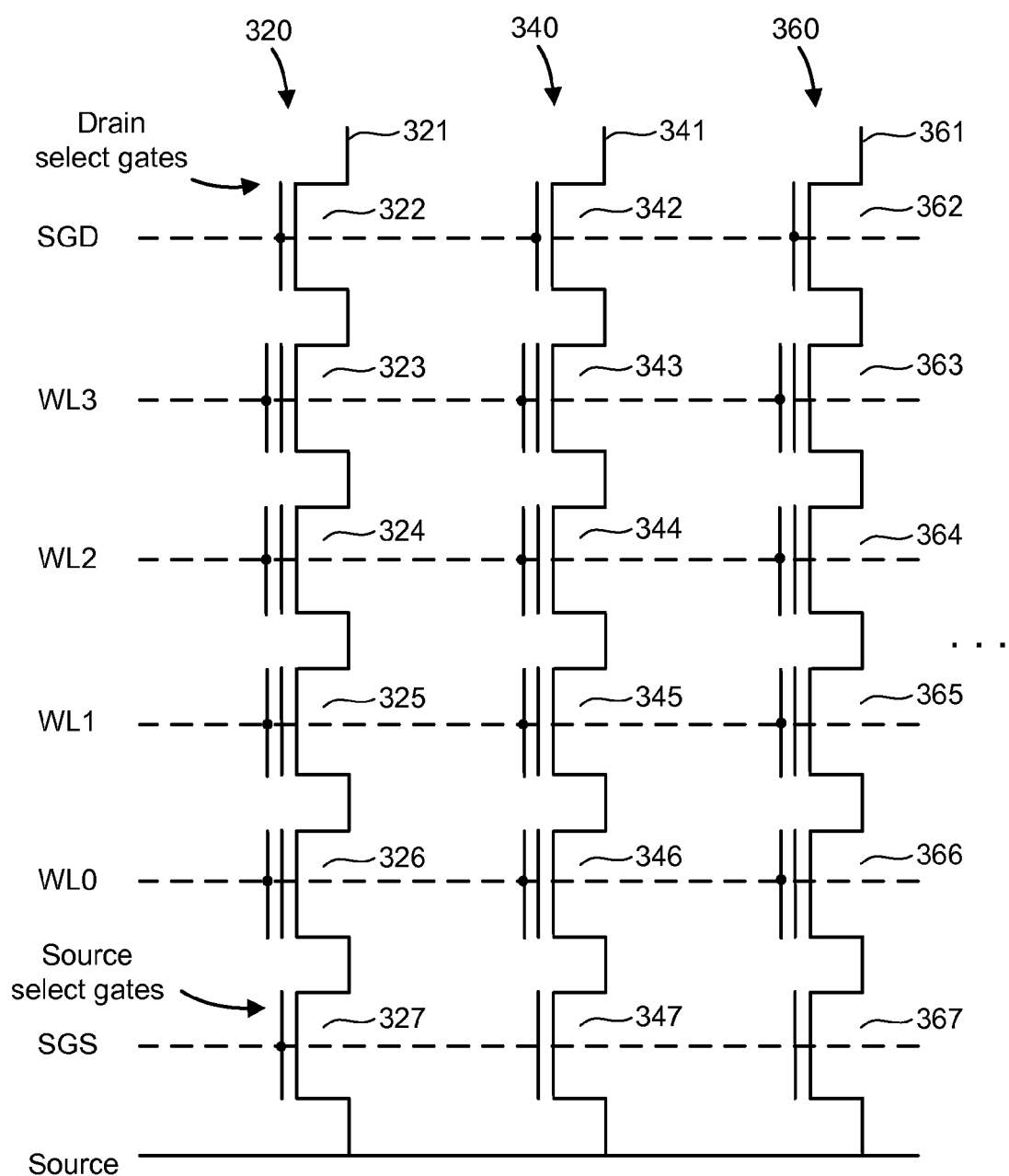
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
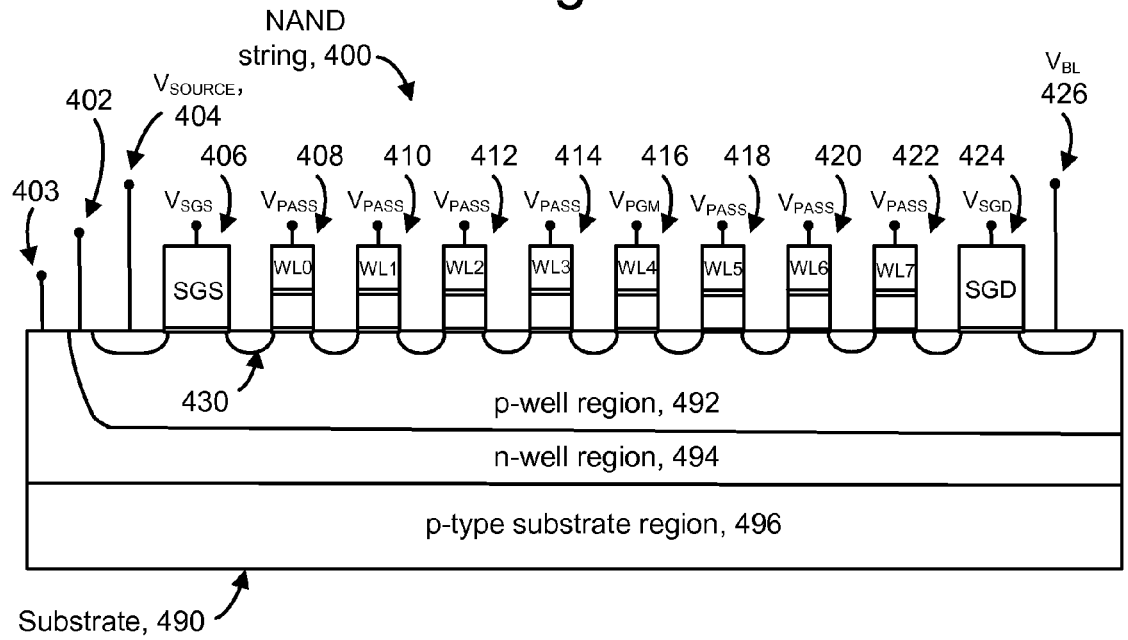
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages can also be applied to the p-well region 492 via a terminal 402 and to the n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. Some boosting schemes apply different pass voltages to different word lines. $V_{SGS}$ and $V_{SGD}$ are applied to the select gates 406 and 424, respectively.

Figure 5:
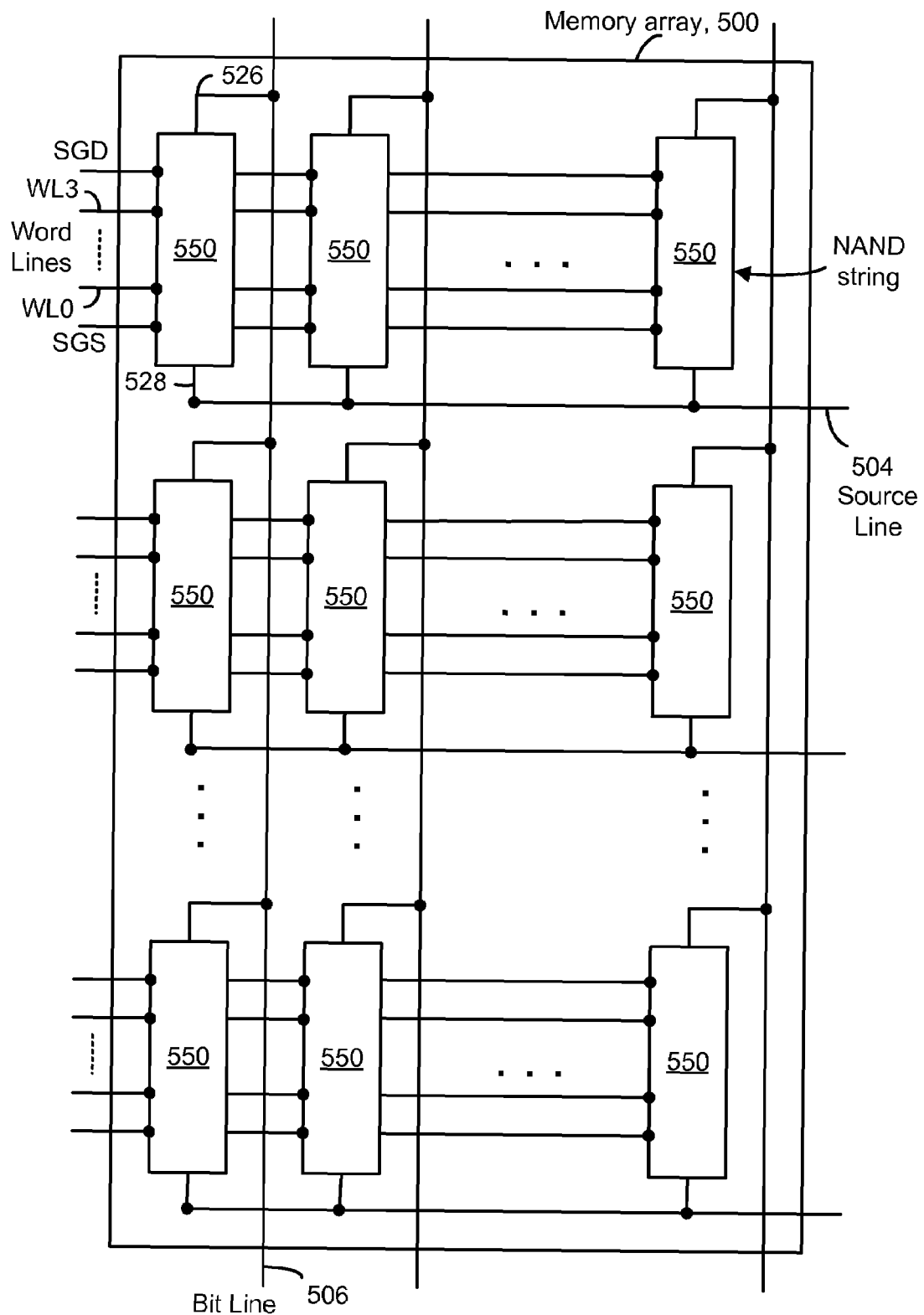
FIG. 5 is a block diagram of an array of NAND flash storage elements.

FIG. 5 illustrates an example of an array 500 of NAND storage elements, such as those shown in FIGS. 1 and 2.

Along each column, a bit line 506 is coupled to the drain terminal 526 of the drain select gate for the NAND string 550. Along each row of NAND strings, a source line 504 may connect all the source terminals 528 of the source select gates of the NAND strings. An example of a NAND architecture array and its operation as part of a memory system is found in U.S. Pat. Nos. 5,570,315, 5,774,397 and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 6:
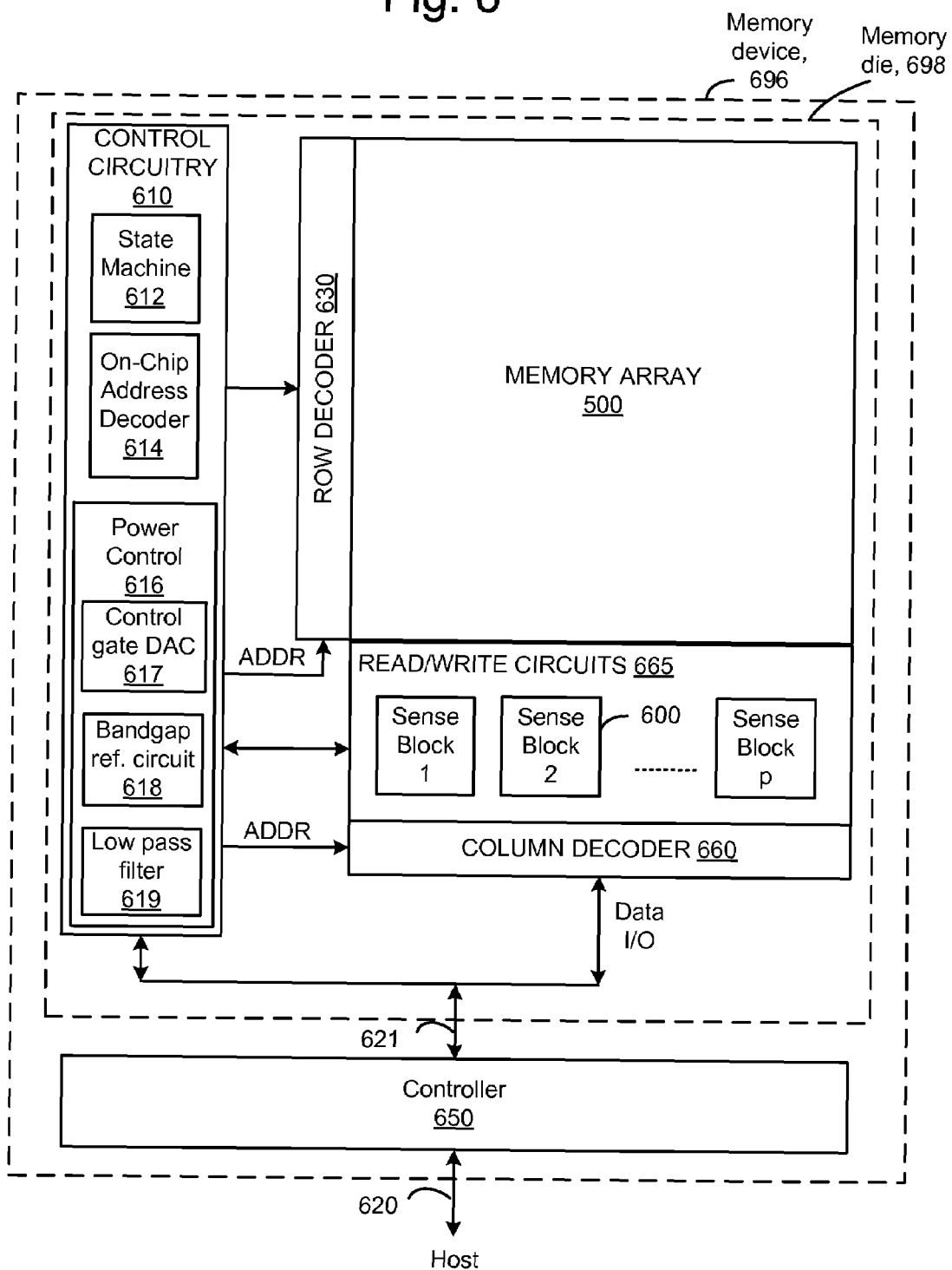
FIG. 6 is a block diagram of a non-volatile memory system using single row/column decoders and read/write circuits.

FIG. 6 is a block diagram of a non-volatile memory system using single row/column decoders and read/write circuits. The diagram illustrates a memory device 696 having read/write circuits for reading and programming a page of storage elements in parallel, according to one embodiment of the present invention. Memory device 696 may include one or more memory die 698. Memory die 698 includes a two-dimensional array of storage elements 500, control circuitry 610, and read/write circuits 665. In some embodiments, the array of storage elements can be three dimensional. The memory array 500 is addressable by word lines via a row decoder 630 and by bit lines via a column decoder 660. The read/write circuits 665 include multiple sense blocks 600 and allow a page of storage elements to be read or programmed in parallel. Typically a controller 650 is included in the same memory device 696 (e.g., a removable storage card) as the one or more memory die 698. Commands and Data are transferred between the host and controller 650 via lines 620 and between the controller and the one or more memory die 698 via lines 621.

The control circuitry 610 cooperates with the read/write circuits 665 to perform memory operations on the memory array 500. The control circuitry 610 includes a state machine 612, an on-chip address decoder 614 and a power control module 616. The state machine 612 provides chip-level control of memory operations. The on-chip address decoder 614 provides an address interface between that used by the host or a memory controller to the hardware address used by the decoders 630 and 660. The power control module 616 controls the power and voltages supplied to the word lines and bit lines during memory operations. For example, the power control module 616 can include a control gate digital-to-analog converter (DAC) 617, a band gap reference circuit 618 and a low pass filter 619, discussed further below.

In some implementations, some of the components of FIG. 6 can be combined. In various designs, one or more of the components (alone or in combination), other than storage element array 500, can be thought of as a managing or control circuit. For example, one or more managing or control circuits may include any one of or a combination of control circuitry 610, state machine 612, decoders 614/660, power control 616, sense blocks 600, read/write circuits 665, controller 650, etc. Generally, any managing or control circuit(s) may be used for evaluating, instructing or otherwise controlling one or more digital-to-analog circuits, whether the managing or control circuit(s) are on the memory device, in a host controller, in test equipment and so forth.

Figure 7:
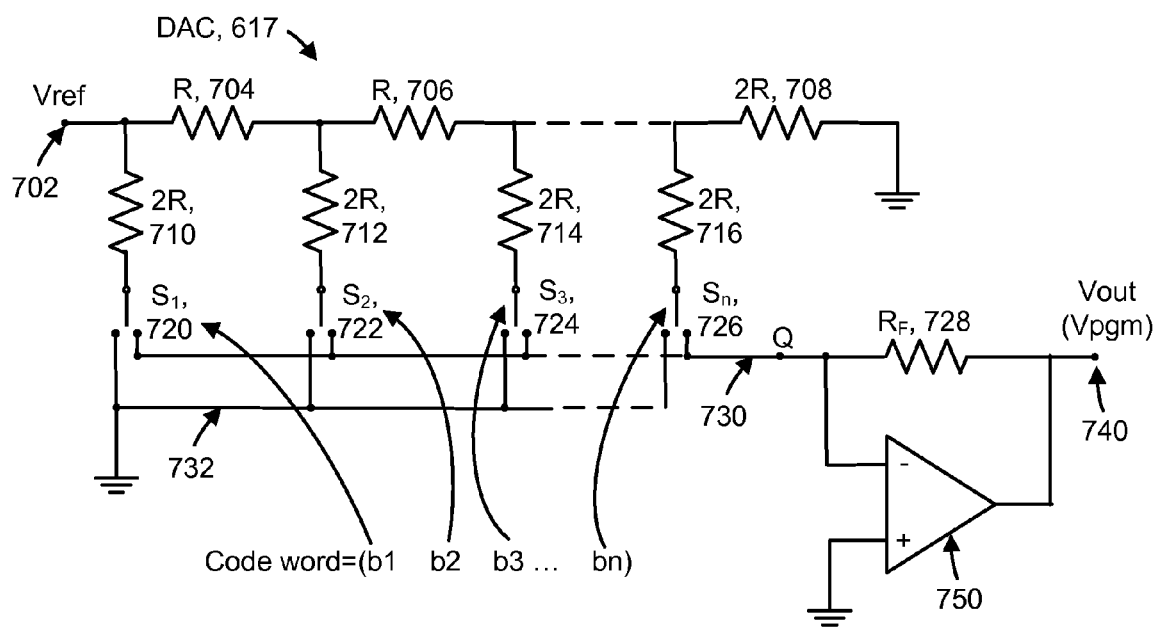
FIG. 7 depicts an example digital-to-analog converter (DAC).

FIG. 7 depicts an example digital-to-analog converter (DAC). Generally, a variety of DACs can be used in a memory device for setting voltages, e.g., on unselected word lines, bit liens and so forth. Moreover, as mentioned, a control gate DAC can be used for providing voltages to word lines which are in communication with the storage elements. Various types of DACs include current scaling, voltage scaling and charge scaling devices. The example DAC 617 is of the current scaling type, and uses an R-2R ladder configuration. Other configurations include a binary weighted resistor ladder. An R-2R ladder is constructed so as to generate a binary weighted current which is then passed through a known resistor ratio so as to generate a binary weighted voltage. Note that the correction techniques described herein are applicable to any type of DAC which exhibits a differential non-linearity (DNL), e.g., a non-uniform step size output.

In particular, the DAC 617 scales a reference voltage $V_{REF}$ at an input terminal 702 to provide an output voltage $V_{OUT}$ at an output terminal 740 as the program voltage $V_{PGM}$. $V_{REF}$ may be provided by the bandgap reference circuit 618 (FIG. 6), for instance. The DAC 617 includes resisters 704 and 706 with a resistance of R, and a resistor 708 with a resistance of 2R. Resistors 710, 712, 714 and 716 with a resistance of 2R are coupled to switches S1 720, S2 722, S3 724 . . . Sn 726, respectively, where n is the number of bits in a code word which is input to the DAC. The code word can be represented by (b1 b2 b3 . . . bn), where b1 is the most significant bit (MSB) and bn is the least significant bit (LSB). Each of the switches Si is connected to a point Q via a path 730 if bi, the ith bit in the code word, is 1 and to ground via a path 732 if bi is 0. The respective switches S1-Sn are thus opened or closed according to the respective bits b1-bn in the code word. Q is an inverting input to an op-amp 750, and the resistor 728 having a resistance of $R_F$ is a feedback resistor.

Nonlinearities in Program Voltage

Figure 8:
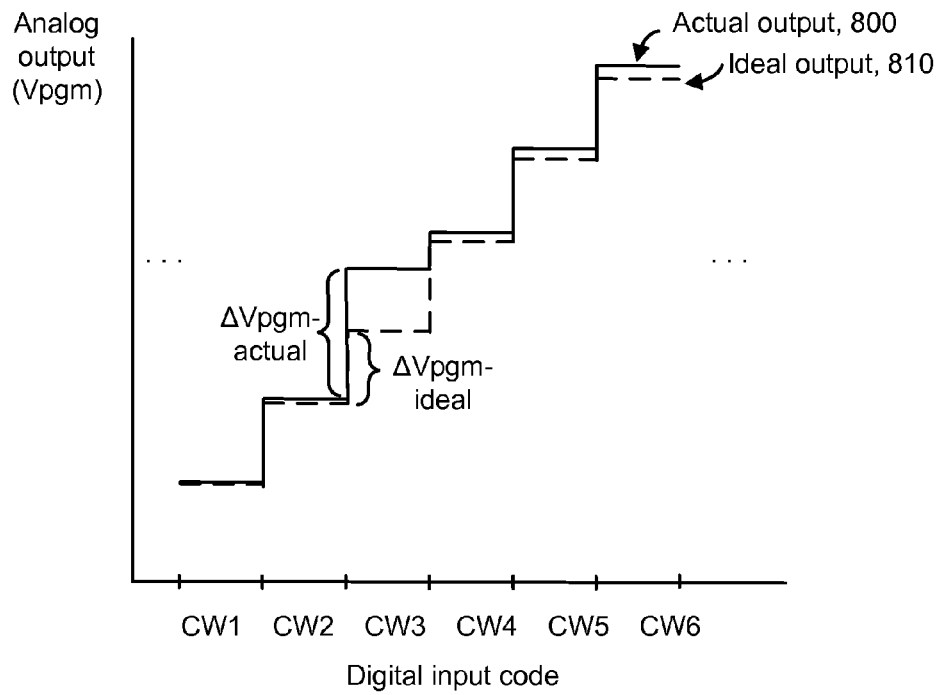
FIG. 8 depicts ideal and actual voltage outputs of a DAC.

FIG. 8 depicts ideal and actual voltage outputs of a DAC. During a program operation, a series of program voltage or pulses may be applied to a selected word line to raise the threshold voltage of the associated storage elements to a desired state. For example, successive code words may be input to a DAC to provide corresponding successive program voltages which increase in a staircase manner. In one approach, the step size is the minimum resolution of the DAC, e.g., 0.2 V in an example implementations. In the example provided, a sequence of digital input code words CW1-CW6 are provided to a DAC. Typically, many more code words are used during programming. The resulting actual voltage output is provided by the solid line 800 and the ideal output is provided by the dashed line 810. In this example, the ideal and actual outputs are equal when the first code word CW1 is input to the DAC. The actual output is slightly higher than the ideal when the second code word CW2 is input to the DAC. When the third code word CW3 is input to the DAC, the actual output diverges substantially from the ideal output. In other words, the actual step size, $\Delta V_{PGM-ACTUAL}$, is greater than the ideal step size, $\Delta V_{PGM-IDEAL}$. This nonlinearity is addressed in the techniques described herein. The actual output is slightly higher than the ideal when the fourth and fifth code words, CW4 and CW5, are input to the DAC.

Figure 9:
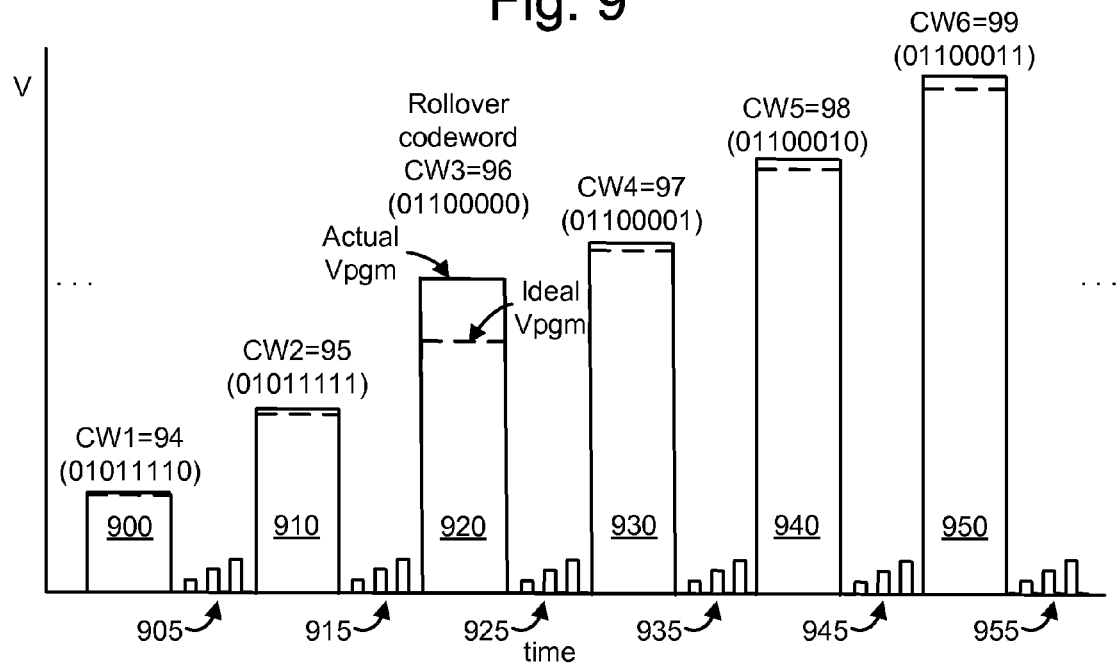
FIG. 9 depicts a time series of program voltages and verify voltages applied to a selected word line.

FIG. 9 depicts a time series of program voltages and verify voltages applied to a selected word line. The time series presented in this and other figures are not necessarily to scale. The time series is based on the DAC response depicted in FIG. 8. The time series includes a series of program pulses 900, 910, 920, 930, 940 and 950 which are output from the DAC in response to code words CW1, CW2, CW3, CW4, CW5 and CW6, respectively. In this example, the base 10 or decimal values of the code words are CW1=94, CW2=95, CW3=96, CW4=97, CW5=98 and CW6=99. The corresponding base 2 or binary values of the code words are CW1=01011110, CW2=01011111, CW3=01100000, CW4=01100001, CW5=01100010 and CW6=01100011. After each program pulse, a series of verify pulses is applied to the selected word line, as depicted by verify pulses 905, 915, 925, 935, 945 and 955. In this case, three verify pulses can be used to distinguish between four logical states. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 24) or Vvb' (FIG. 25a), for instance.

CW3 is referred to as a rollover code word because six of the bits change, or rollover, relative to the previous code word, CW2. Specifically, the first five LSBs rollover from 1 to 0, and the sixth LSB rolls over from 0 to 1. Thus, CW3 has six rollover bits. In a sequence of code words, a given number of bits rollover at different intervals in the sequence. A codeword which has a relatively large number of rollover bits may be associated with nonlinearities in a DAC. In the example of FIG. 9, CW3 results in a significant nonlinear increase in $V_{PGM}$.

Figure 10:
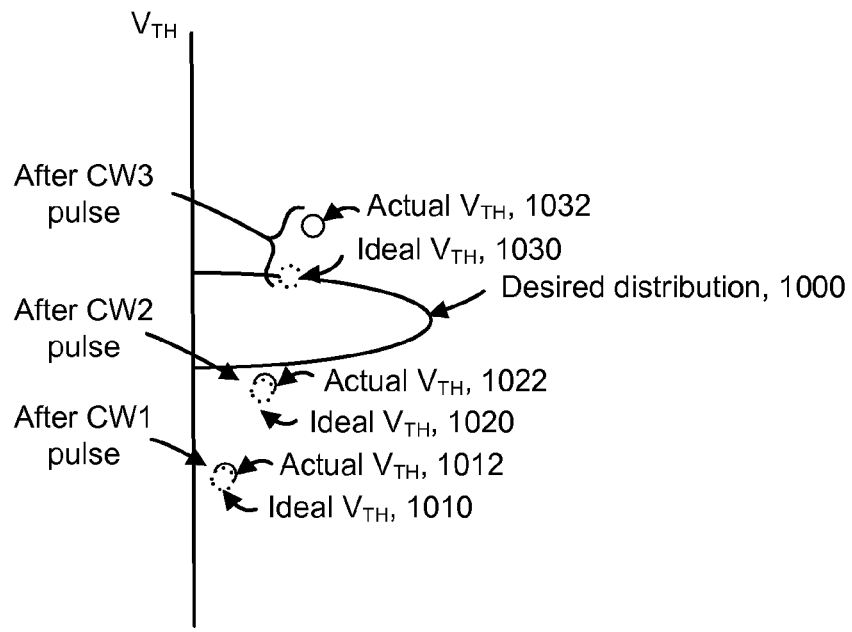
FIG. 10 depicts the impact on threshold voltage of a storage element due to non-uniform steps in program voltage.

FIG. 10 depicts the impact on threshold voltage of a storage element due to non-uniform steps in program voltage. The desired $V_{TH}$ distribution 1000 for a given logical state is depicted. After a first program pulse, which is based on CW1, the ideal and actual $V_{TH}$ are depicted at 1010 and 1012, respectively. After a second program pulse, which is based on CW2, the ideal and actual $V_{TH}$ are depicted at 1020 and 1022, respectively. The $V_{TH}$ is still below the desired distribution 1000. However, after a third program pulse, which is based on CW3, the ideal $V_{TH}$ 1030 is within the desired distribution 1000, but the actual $V_{TH}$ 1032 exceeds the desired distribution. Note that this is a simplified example. Depending on the logical state and the pulse step size, additional pulses may be needed to raise the $V_{TH}$ to the desired distribution.

The nonlinear DAC output which is based on CW3 thus results in over programming. Generally, it is important for the amplitudes of the program voltages to be carefully controlled so that the storage elements can be programmed quickly but without over programming. When a larger than ideal $V_{PGM}$ step size occurs just before a program algorithm lock-out, it can result in over programming and wider programming distributions. On the other hand, if the program voltages are lower than expected, programming time may be extended unnecessarily.

In particular, the threshold voltage $V_{TH}$ of a storage element increases as a program voltage $V_{PGM}$ is applied. For example, under steady state programming conditions, $\Delta V_{TH}=K \times \Delta V_{PGM}$, where K is a proportionality constant close to, but slightly less than, one. Under ideal conditions, the programming process sets each storage element within a window or distribution width of $\Delta V_{TH} \approx \Delta V_{PGM}$. In reality, as depicted in FIG. 8, the on-chip programming voltage, $V_{PGM}$, may not have a perfectly linear response relative to the DAC setting. Specifically, $\Delta V_{PGM}$ may not be constant as each successive code word is input to the DAC. This can result in variations in programming rate compared to expected results. Thus, the programmed distribution width might be wider than expected. In general, the performance will be limited by the maximum $\Delta V_{PGM}$ within the sequence. The DAC non-linearity may result from both systematic variations, e.g., due to layout mismatches as well as random variations, e.g., due to transistor $V_{TH}$ offsets or resistor mismatches. For instance, nominally specified resistor values may not match correctly, or voltages which are nominally equal may have some voltage offset. Note, for example, in FIG. 7, there are three "ground" voltages. These can be "virtual grounds" that are actually driven by another voltage source, and are nominally equal. However, in some designs, these voltages are not equal and this will cause an error in the output. Furthermore, these inequalities may depend on the loading or other condition of the chip. These errors can generate both errors in the absolute value of the output, referred to as Integral Non-Linearity or INL errors, as well as errors in the step size between two adjacent pulses, referred to as Differential Non-Linearity or DNL errors.

Generally, the linearity of the DAC can be improved by design or layout. Systematic errors can be minimized with this approach. Post-fabrication measurement and correction by trimming can also be performed. The trimming may be achieved by post-fabrication adjustment of the analog components to correct for mismatches or re-scaling or altering the digital input code, e.g., using a look-up-table, such that the output appears linear in re-scaled terms. However, these methods cannot be used if the DAC, e.g., is already operating at a minimum resolution, and may be less than optimal otherwise. The minimum resolution is the smallest analog change that can be produced by the DAC.

Figure 11:
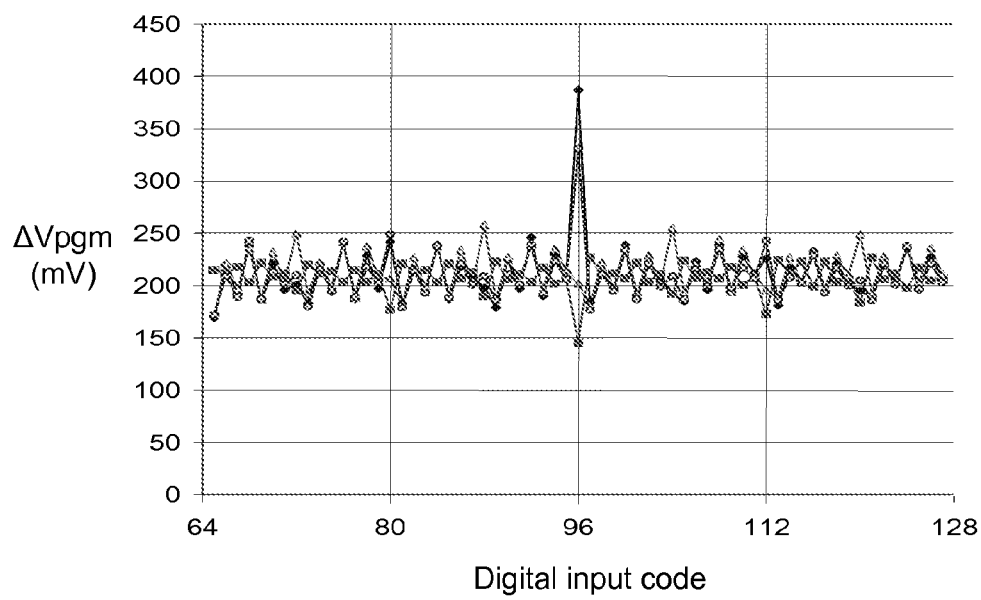
FIG. 11 depicts program voltage step size for different DAC input codes and different memory devices.

FIG. 11 depicts program voltage step size for different DAC input codes and different memory devices. Data from four different memory devices is depicted by diamonds, squares, triangles and circles. The x-axis depicts the digital input code, which ranges from 64 to 128, while the y-axis depicts the program voltage step size $\Delta V_{PGM}$ in mV. The ideal value for $\Delta V_{PGM}$ is approximately 200 mV. Experimentally, we observe that differential nonlinearities tend to occur at regular DAC code settings. Further, these settings can correspond to rollover locations in the binary code. For example, as mentioned, the transition between code words 95 (01011111) and 96 (01100000) represents six bits rolling over. This is a consequence of the R-2R DAC construction. However, nonlinearities in the output of a DAC can occur for other reasons as well. Experimental observations will reveal these nonlinearities regardless of their source. Also, note that both positive and negative errors occur. A positive error denotes a larger than ideal $V_{PGM}$ step size and a negative error denotes a smaller than ideal $V_{PGM}$ step size.

Figure 12:
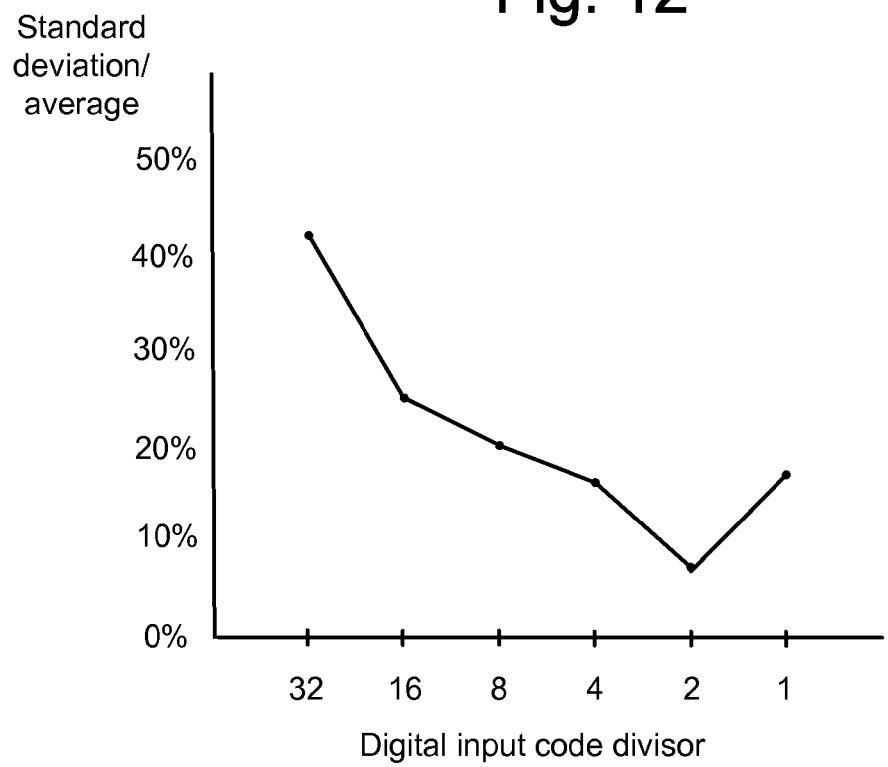
FIG. 12 depicts a dependence of program voltage step size error as a function of DAC input code divisor.

FIG. 12 depicts a dependence of program voltage step size error as a function of DAC input code divisor. The x-axis depicts a digital input code divisor or binary weight, while the y-axis depicts a ratio of a standard deviation of $\Delta V_{PGM}$ at a particular code divisor to an average $\Delta V_{PGM}$ for all code divisors. Code divisors of 32, 16, 8, 4, 2 and 1 represent code words which have 6, 5, 4, 3, 2 or 1 rollover bits, respectively, relative to a prior code word in a code word sequence which is input to a DAC. Statistical evidence indicates that $\Delta V_{PGM}$ errors tend to cluster on DAC codes according to the binary weight (DAC code divisor). By trimming the single code at 96 (DAC divisor=32), which has six rollover bits, the worst case standard deviation can be reduced from 42% to 25%. By trimming the two additional codes at 80, 112 (DAC divisor=16), which have five rollover bits, the worst case standard deviation can be reduced further from 25% to 20%, and so on. Specifically, code 80 (1010000 in binary) varies by five bits from code 79 (1001111 in binary), and code 112 (1110000 in binary) varies by five bits from code 111 (1101111 in binary). In this example, the range of code words of concern is 64 to 128. Codes which have four rollover bits in this range are 72 (1001000), 88 (1011000), 104 (1101000) and 120 (1111000). By trimming the codes that have four rollover bits, the worst case standard deviation can be reduced further from 20% to 15%, and so on. The data provided represents one possible example scenario among many.

Generally, a decision can be made to take a corrective action when a code word has a threshold number of rollover bits. With a higher threshold, corrective action is made for fewer code words. With a lower threshold, corrective action is made for more code words. The amount of correction or trimming which is needed can be minimized by applying correction only to those codes which are associated with a relatively large nonlinear output. Again, this approach can be used regardless of the cause of the nonlinearity. This will minimize the amount of on-chip circuitry, on-chip memory, and/or testing that is required. Even if only the single worst code is addressed, as mentioned, this results in a substantial reduction in the $V_{PGM}$ step size variation, e.g., from 42 to 25%, in the present example.

Correcting Nonlinearities in Program Voltage

Figure 13:
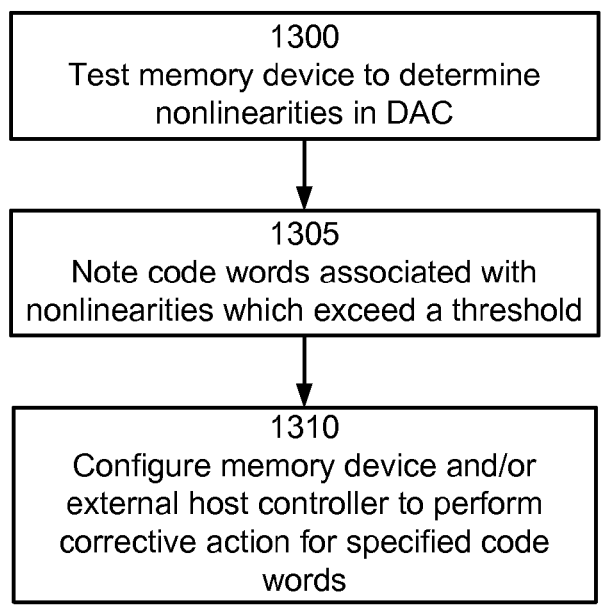
FIG. 13 depicts a process for identifying code words which are associated which nonlinear behavior of a DAC.

FIG. 13 depicts a process for identifying code words which are associated which nonlinear behavior of a DAC. Step 1300 includes testing a memory device to determine nonlinearities in the DAC. For example, an output such as shown in FIG. 11 can aid in this determination. The output can be processed automatically, in one approach. Step 1305 includes noting code words associated with nonlinearities which exceed a threshold. For example, these may be rollover code words, as discussed, although nonlinearities may be associated with other code words additionally or alternatively. Step 1310 includes configuring the memory device and/or an external host controller to perform a corrective action for the specified code words.

In one approach, a trim or correction technique may be used in which trimming is applied to only those DAC settings which have a differential nonlinearity which has a magnitude and sign beyond an allowed threshold. The number of such targeted settings can be determined in advance, during design and before manufacture. Moreover, the trimming can be achieved in different ways. One approach involves adjusting the pulse width for the affected DAC settings such that the effective $V_{TH}$ shift is closer to the desired value even though the program voltage is not at its desired value. In other approaches, parameters other than pulse width can be adjusted.

In one approach, we can correct more than one, and up to several, of the expected worst case codes. In a further approach, there may be several correction terms which are summed according to the binary codes involved. For example, the correction for code 00010001 could be the correction code for 00010000 plus the correction code for 00000001. So, for an n-bit DAC, up to n corrections would be expected. This is still considerably less than the $2^N$ number of corrections required for fully arbitrary correction. The choice of how many and which codes to correct can be made at the design stage, for instance. Once a decision is made as to which codes (or code intervals) should be targeted, a variety of techniques can be used for compensating for these non-ideal cases.

Figure 14:
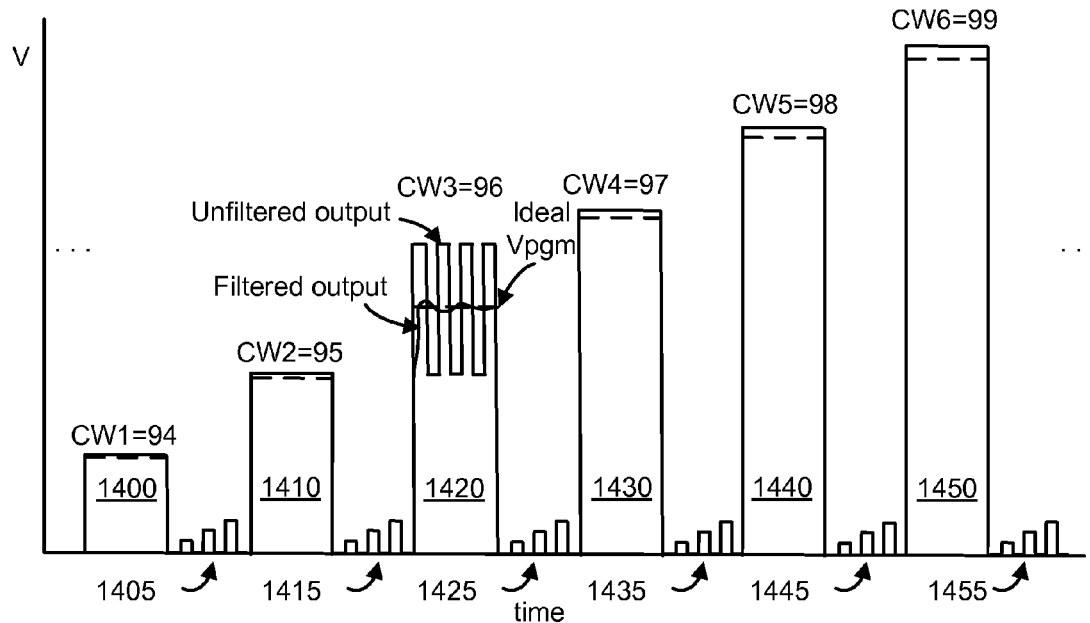
FIG. 14 depicts a time series of program voltages and verify voltages applied to a selected word line, where a program pulse is obtaining by toggling an input to a DAC while low pass filtering an output of the DAC.

FIG. 14 depicts a time series of program voltages and verify voltages applied to a selected word line, where a program pulse is obtaining by toggling an input to a DAC while low pass filtering an output of the DAC. The time series includes a series of program pulses 1400, 1410, 1420, 1430, 1440 and 1450 which are output from the DAC in response to code words CW1, CW2, CW2/CW3, CW4, CW5 and CW6, respectively, having values of 94, 95, 95/96, 97, 98 and 99, respectively. Verify pulses 1405, 1415, 1425, 1435, 1445 and 1455 are also provided. CW3=96 is a code word which is associated with a nonlinear $V_{PGM}$ step size. Here, the input code word to the DAC is toggled between CW2 and CW3, and the output of the DAC is low pass filtered to obtain a filtered output at a level which approximates the ideal $V_{PGM}$ level.

Figure 15:
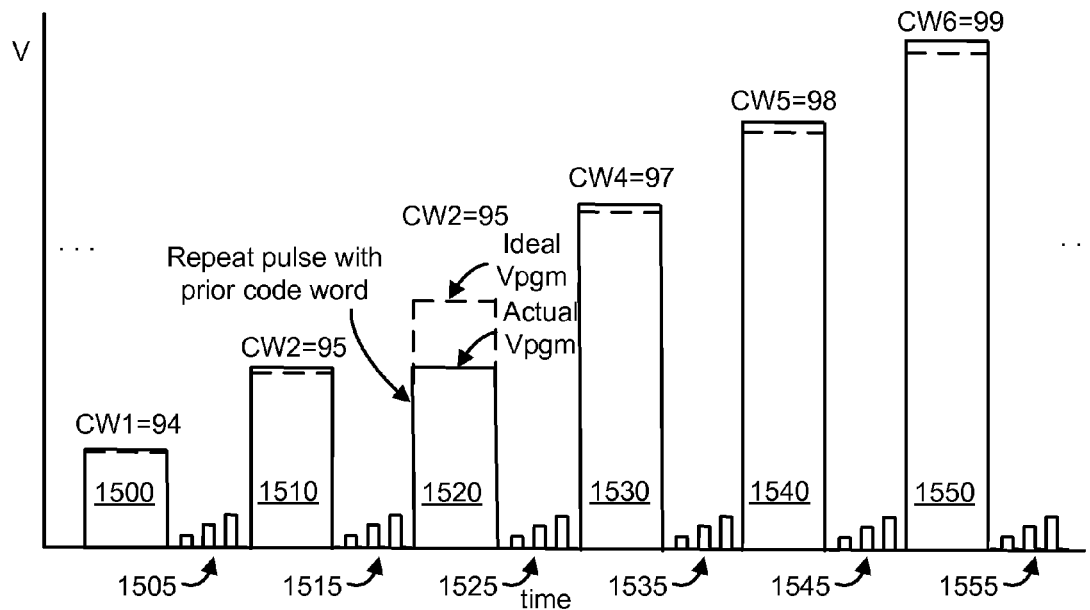
FIG. 15 depicts a time series of program voltages and verify voltages applied to a selected word line, where a program pulse is repeated.

FIG. 15 depicts a time series of program voltages and verify voltages applied to a selected word line, where a program pulse is repeated. The time series includes a series of program pulses 1500, 1510, 1520, 1530, 1540 and 1550 which are output from the DAC in response to code words CW1, CW2, CW2, CW4, CW5 and CW6, respectively, having values of 94, 95, 95, 97, 98 and 99, respectively. Verify pulses 1505, 1515, 1525, 1535, 1545 and 1555 are also provided. Here, for $\Delta V_{PGM}$ intervals which are larger than some threshold limit, the value of the previous $V_{PGM}$ pulse is repeated one or more times. In this example, pulse 1510 is repeated as pulse 1520. For example, if CW3=96 is a code word which is associated with a nonlinear $V_{PGM}$ step size, the previous code word CW2=95 can be input to the DAC in place of CW3, so that CW2 is input twice in a row. Subsequently, the code word sequence is resumed by inputting CW4, CW5 and CW6 to the DAC.

A repeated pulse can provide a $\Delta V_{PGM}$ step ranging from, e.g., ⅓ of a normal step up to a full step, for instance, based on empirical results. The actual value depends on the specific timing and step size. Thus, the abnormally large $\Delta V_{PGM}$ which would otherwise result if CW3 was input to the DAC will be reduced by approximately the amount of this step. This approach requires very little additional logic, hardware and/or memory storage. For example, the technique may be implemented by a "repeat bit" representing each potential interval. At first inspection, it might appear that this extra pulse(s) will increase the number of loops required (by the number of repeat events). A loop refers to a program and verify pass. Note however, that this extra pulse is essentially making up for a "missing code" where the $\Delta V_{PGM}$ was known to be too large, in which case the programming loop would have ended too early. In such cases, the net impact on loop count is expected to be minor.

The number of repeat pulses can be greater than one when $\Delta V_{PGM}$ exceeds a second threshold limit, and so on. Generally, the number of repeat pulses can be N1 when $\Delta V_{PGM}$ exceeds the ideal $\Delta V_{PGM}$ by a first threshold amount T1, the number of repeat pulses can be N2 when $\Delta V_{PGM}$ exceeds the ideal $\Delta V_{PGM}$ by a second threshold amount T2, and the number of repeat pulses can be N3 when $\Delta V_{PGM}$ exceeds the ideal $\Delta V_{PGM}$ by a third threshold amount T3, where N1<N2<N3 and T1<T2<T3. Analogous corrections can be made when $\Delta V_{PGM}$ falls below the ideal $\Delta V_{PGM}$.

In a further variation, the repeat pulse is not necessarily identical to the previous pulse. One may select one or several DAC codes of any value up to (but less than) the offending DAC code which produces the too large $\Delta V_{PGM}$. For example, CW1 may be input to the DAC in place of CW3.

FIG. 16 depicts a time series of program voltages and verify voltages applied to a selected word line, where a duration of a program pulse is adjusted. The time series includes a series of program pulses 1600, 1610, 1620, 1630, 1640 and 1650 which are output from the DAC in response to code words CW1, CW2, CW3, CW4, CW5 and CW6, respectively, having values of 94, 95, 96, 97, 98 and 99, respectively. Verify pulses 1605, 1615, 1625, 1635, 1645 and 1655 are also provided. Here, the duration of the pulse 1620 which corresponds to the nonlinear $\Delta V_{PGM}$ is shortened relative to the other pulses, e.g., relative to an average duration of the other pulses. Generally, when $\Delta V_{PGM}$ is higher than ideal, the pulse duration can be shortened and when $\Delta V_{PGM}$ is lower than ideal, the pulse duration can be lengthened. CW3=96 is a code word which is associated with a nonlinear $V_{PGM}$ step size.

FIG. 17 depicts a time series of program voltages and verify voltages applied to a selected word line, where a duration of a selected program pulse is shortened and a duration of a prior program pulse is lengthened. The time series includes a series of program pulses 1700, 1710, 1720, 1730, 1740 and 1750 which are output from the DAC in response to code words CW1, CW2, CW3, CW4, CW5 and CW6, respectively, having values of 94, 95, 96, 97, 98 and 99, respectively. Verify pulses 1705, 1715, 1725, 1735, 1745 and 1755 are also provided. CW3=96 is a code word which is associated with a nonlinear $V_{PGM}$ step size. Here, the duration of the pulse 1720 which corresponds to the nonlinear $\Delta V_{PGM}$ is shortened relative to the other pulses, or an average duration of the other pulses, and the duration of the preceding pulse, pulse 1710, is lengthened relative to the other pulses. Generally, when $\Delta V_{PGM}$ is higher than ideal, the duration of the corresponding pulse can be shortened while the duration is lengthened for a prior pulse, which can include the immediately prior pulse, a prior pulse which is not immediately preceding, as well as multiple preceding pulses. When $\Delta V_{PGM}$ is lower than ideal, the duration of the corresponding pulse can lengthened. In this case, optionally, the duration is shortened for one or more prior pulses.

This approach involves adjusting the ratio of the pulse widths of the pulse for which the $\Delta V_{PGM}$ is too high or low compared to the ideal, and one or more previous pulses. This has the effect of allowing the $\Delta V_{TH}$ of the storage elements being programmed to move more (for a longer pulse width) or less (for a shorter pulse width) than would be expected according to the steady-state relation. Thus the $\Delta V_{TH}$ can become more balanced during programming. Note that $\Delta V_{PGM}$ still demonstrates the original error; however, we compensate by allowing $\Delta V_{TH}$ to deviate from the steady state in a controlled way. Note also that the resolution of pulse timing needed to implement this correction is easier than attempting a resolution of voltage, due to the logarithmic relation between programming time and threshold voltage. Note also that, in the limiting case where the prior pulse width is twice the normal width, this approach resembles the proposal in which the prior pulse is repeated. This approach has the impact of distributing the $\Delta V_{TH}$ variation into the preceding and following intervals. Care should be taken to avoid extending pulse duration so much that $\Delta V_{TH}$ becomes too great, resulting in over programming.

Figure 18:
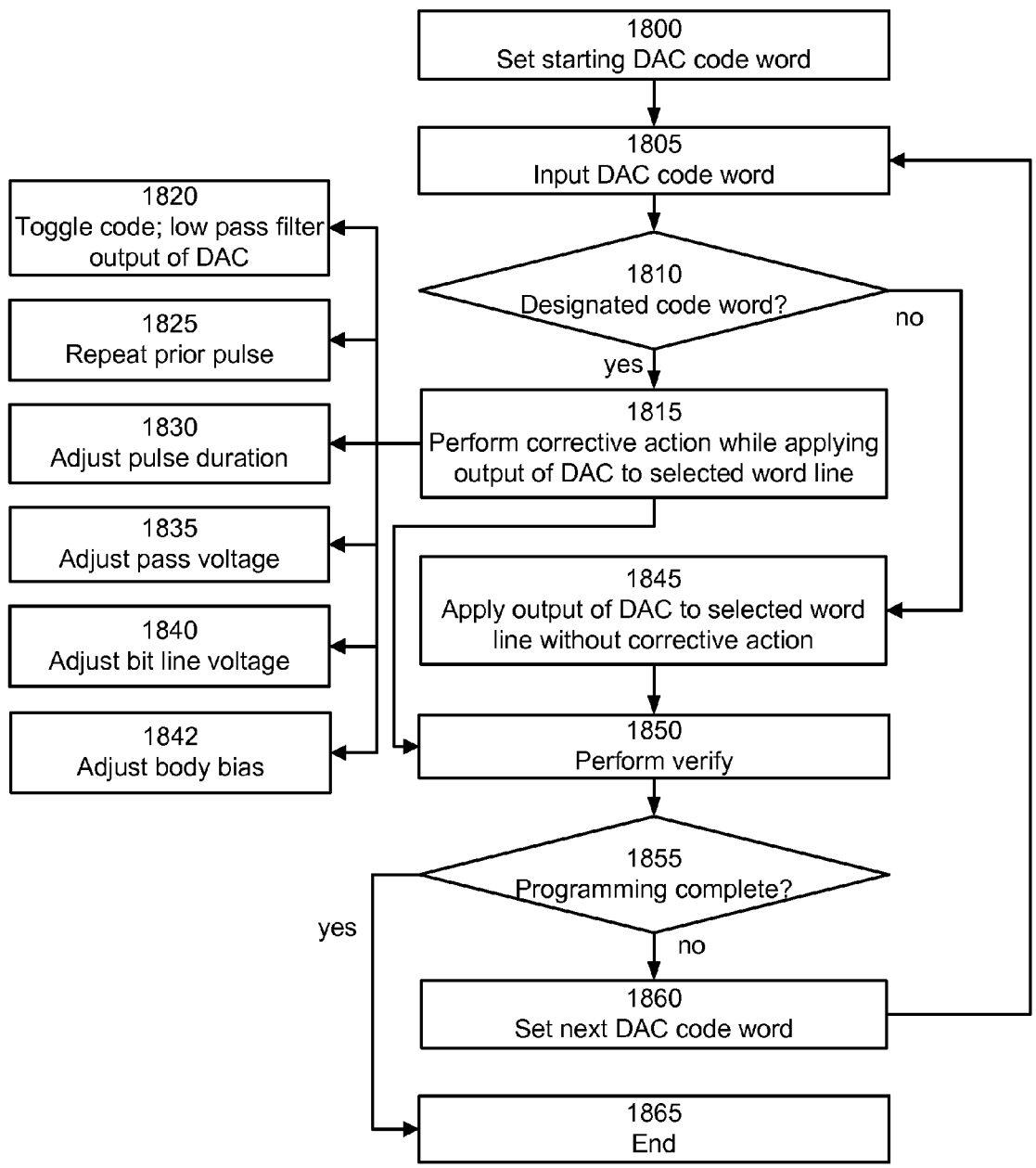
FIG. 18 depicts a process for programming storage elements in which a corrective action is performed for a designated code word.

FIG. 18 depicts a process for programming storage elements in which a corrective action is performed for a designated code word. Note that the steps shown in this and other flowcharts need not necessarily occur as discrete steps or in the order shown. For example some steps can occur at least partly in parallel. At step 1800, a starting DAC code word is set. For instance, a sequence of code words may extend from 64 to 128 during a program operation, in which case the starting code word=64. Note that typically the program voltages are in the form of an ascending staircase, in which each successive pulse is greater than the previous step. However, other approaches are possible as well. For example, multiple pulses at a fixed amplitude may be used follow by multiple pulses at a second amplitude. Further, a strictly ascending staircase need not be used. Some programming techniques employee one or more high pulses initially to kick start the programming process, followed by lower amplitude pulses. The pulses sequence can include a descending staircase. Moreover, each program pulse need not have a fixed amplitude. Individual pulses may have varying amplitudes, including ramp or staircase shaped amplitudes, if sufficient voltage resolution is available.

At step 1805, the code word is input to the DAC. At decision step 1810, if the code word is a designated code word, e.g., a code word for which the output of the DAC is nonlinear, a corrective action is performed while applying the output of the DAC to the selected word line, at step 1815. This can involve one or more of a number of different approaches. For example, one approach, at step 1820, is to toggle the code while performing a low pass filtering of the output of the DAC, as discussed, e.g., in connection with FIG. 14. Another approach, at step 1825, is to repeat a prior pulse, as discussed, e.g., in connection with FIG. 15. In this case, the prior code word which is associated with the prior pulse is input to the DAC in place of the designated code word so that the DAC outputs a pulse with an amplitude corresponding to the prior code word instead of the designated code word. Another approach, at step 1830, is to adjust the pulse duration, as discussed, e.g., in connection with FIGS. 16 and 17. For example, the current pulse duration can be adjusted. Another approach, at step 1835, is to adjust a pass voltage of one or more neighboring word lines to the selected word line. Another approach, at step 1840, is to adjust a bit line voltage of a bit line which is associated with a selected storage element, e.g., via an associated NAND string. Another approach, at step 1842, is to adjust a body bias which is associated with a selected storage element, e.g., via terminal 402 which is connected to a p-well and/or terminal 403 which is connected to an n-well (see FIG. 4).

Generally, nonlinearities in a DAC can be accounted for by adjusting other parameters which do not involve the DAC. The parameters which are selected should provide a fine degree of adjustment of $\Delta V_{TH}$. For example, regarding step 1835, adjusting the $V_{PASS}$ of one or more neighboring word lines by an amount such as ±1V can, through coupling, adjust the effective programming voltage by approximately ±100 mV, assuming a 10:1 coupling ratio. The neighboring unselected word lines at $V_{PASS}$ couple a fraction of the voltage to the selected word line. This coupling creates an "effective $V_{PGM}$" equal to the applied $V_{PGM}$ plus the coupled portion of $V_{PASS}$. So, a 1V change on Vpass would be equivalent to a fractional voltage change of the "effective Vpgm" seen by the selected word line. Since the amount of "effective $V_{PGM}$" is scaled by the fractional coupling, adjusting of $V_{PASS}$ can be used as a form of fine-tuning. For instance, when the DAC output is too high, the $V_{PASS}$ can be lowered below its nominal level, and, when the DAC output is too low, the $V_{PASS}$ can be raised above its nominal level. Testing can be performed to determine an appropriate amount by which to adjust the pass voltage. Further the amount by which the pass voltage is adjusted can be a function of the DAC output level (e.g., $V_{PGM}$ level).

Regarding step 1840, the voltage on the selected bit line, which is nominally 0V to allow programming to occur, can be set higher momentarily to suppress the effects of a too large $\Delta V_{PGM}$. This is equivalent to suppressing the effects of a too large $\Delta V_{TH}$ since $\Delta V_{PGM}$ correlates with $\Delta V_{TH}$. In some programming techniques, the bit line is nominally at a non-zero level to slow down programming. For example, coarse/fine mode programming can involve a fine mode in which the bit line is raised to partially inhibit programming on storage elements whose $V_{TH}$ has reached a level close to the desired $V_{TH}$. In any case, the bit line can be raised above its nominal level, where it would be in the absence of a DAC nonlinearity-based correction, to correct for a too high $V_{PGM}$.

Regarding step 1842, a bias can be applied to the non-volatile storage elements by applying a bias voltage $V_B$ to the p-well region while grounding the n-well region (0 V). In another approach, a bias is applied to the non-volatile storage elements by applying $V_B$ to both the p-well region and the n-well region. Typically, programming speed is slowed when a negative bias voltage is applied.

These adjustments result in adjusting the programming speed of the selected storage elements. Any of the correction techniques discussed herein can be used alone or in combination.

In practice, information can be loaded, e.g., from a look up table which is cross referenced to the code words, to obtain the appropriate parameters for configuring the memory device for each program pulse. For instance, the parameters can indicate the duration of one or more pulses, whether toggling and low pass filtering is to occur and/or values for adjusting pass voltage, bit lines voltages or body bias voltages, for instance.

If the code word is not a designated code word, at decision step 1820, the output of the DAC is applied to the selected word line without performing a corrective action, at step 1845. A verify operation is performed at step 1850, such as by applying verify pulses to the selected word line and determining whether the storage elements are conductive. If a storage element is not conductive, this indicates its $V_{TH}$ exceeds the verify level, in which case the storage element can be locked out from further programming such as by raising its bit line. If a storage element is conductive, this indicates its $V_{TH}$ does not exceed the verify level, in which case the storage element is not locked out from further programming, as long as a limit on the number of program pulses is not yet reached.

If programming is complete at decision step 1855, e.g., all storage elements have been programmed, or the limit on the number of program pulses is reached, the process ends at step 1865. If programming is not complete at decision step 1855, the next code in the sequence of code words is set at step 1860 and the code word is input to the DAC at step 1805, in a further loop through the process.

Figure 19:
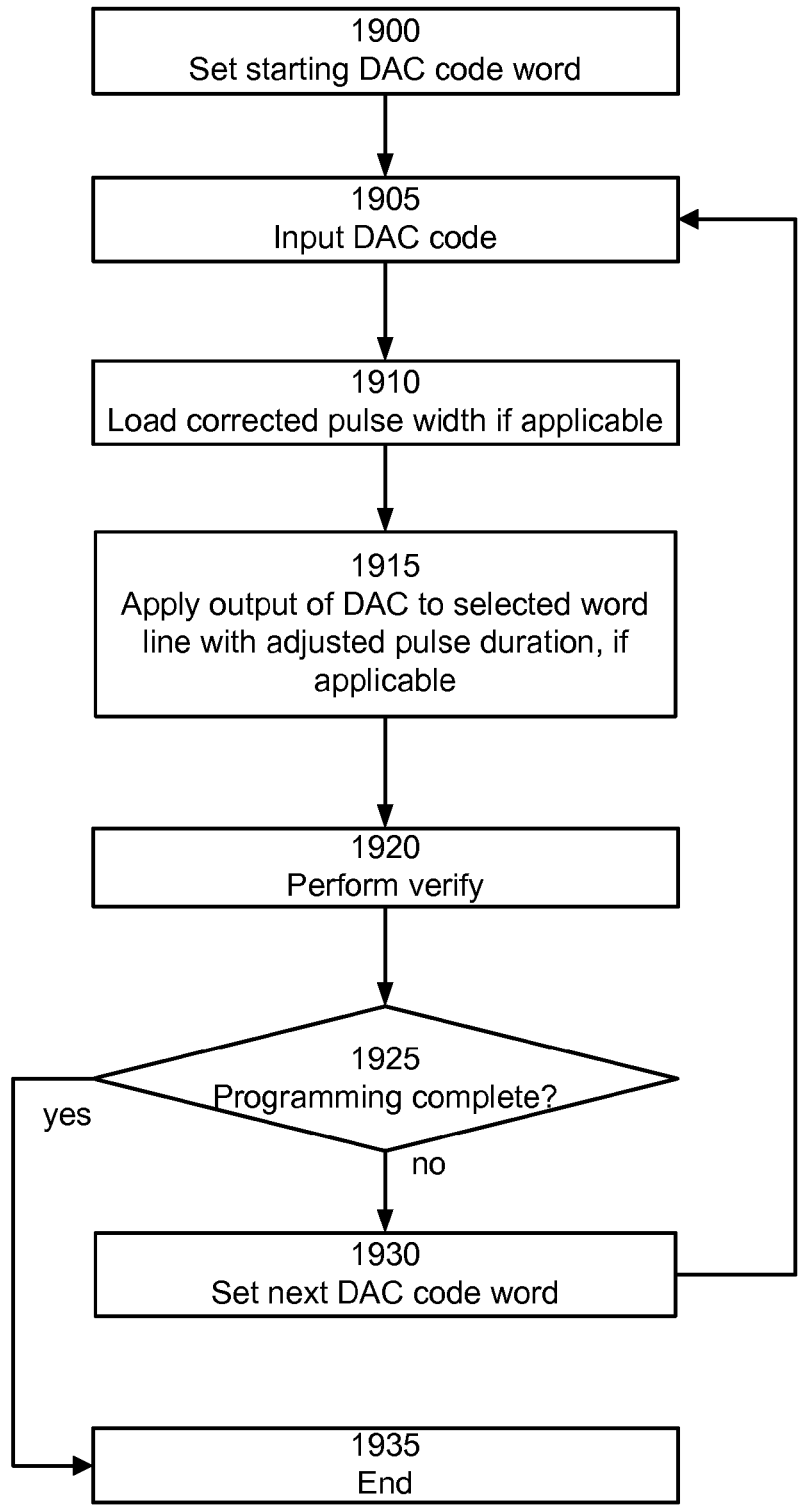
FIG. 19 depicts a process for programming storage elements in which a corrective action involving an adjusted pulse width is performed for a designated code word.

FIG. 19 depicts a process for programming storage elements in which a corrective action involving an adjusted pulse width is performed for a designated code word. Here, a capability is provided to adjust the duration of individual pulses, e.g., so that a program pulse which is before a program pulse with a nonlinear $\Delta V_{PGM}$ can be adjusted, in addition to adjusting the program pulse with the nonlinear $\Delta V_{PGM}$. In this case, the prior program pulse is directly before the program pulse with the nonlinear $\Delta V_{PGM}$. The process can be modified to modify one or more prior pulses, whether or not they are directly before the program pulse with the nonlinear $\Delta V_{PGM}$.

Specifically, step 1900 includes setting a starting DAC code word. At step 1905, the code word is input to the DAC. At step 1910, corrected pulse width information is loaded, if applicable. For instance, a corrected pulse width may be provided for a pulse which is prior to the program pulse with the nonlinear $\Delta V_{PGM}$. Step 1915 includes applying the output of the DAC to the selected word line with an adjusted pulse duration, if applicable. A nominal pulse duration is used if an adjustment is not applicable. Step 1920 includes performing a verify operation. If programming is complete at decision step 1925, the process ends at step 1935. If programming is not complete at decision step 1925, the next code in the sequence of code words is set at step 1930 and the code word is input to the DAC at step 1905, in a further loop through the process.

Figure 20:
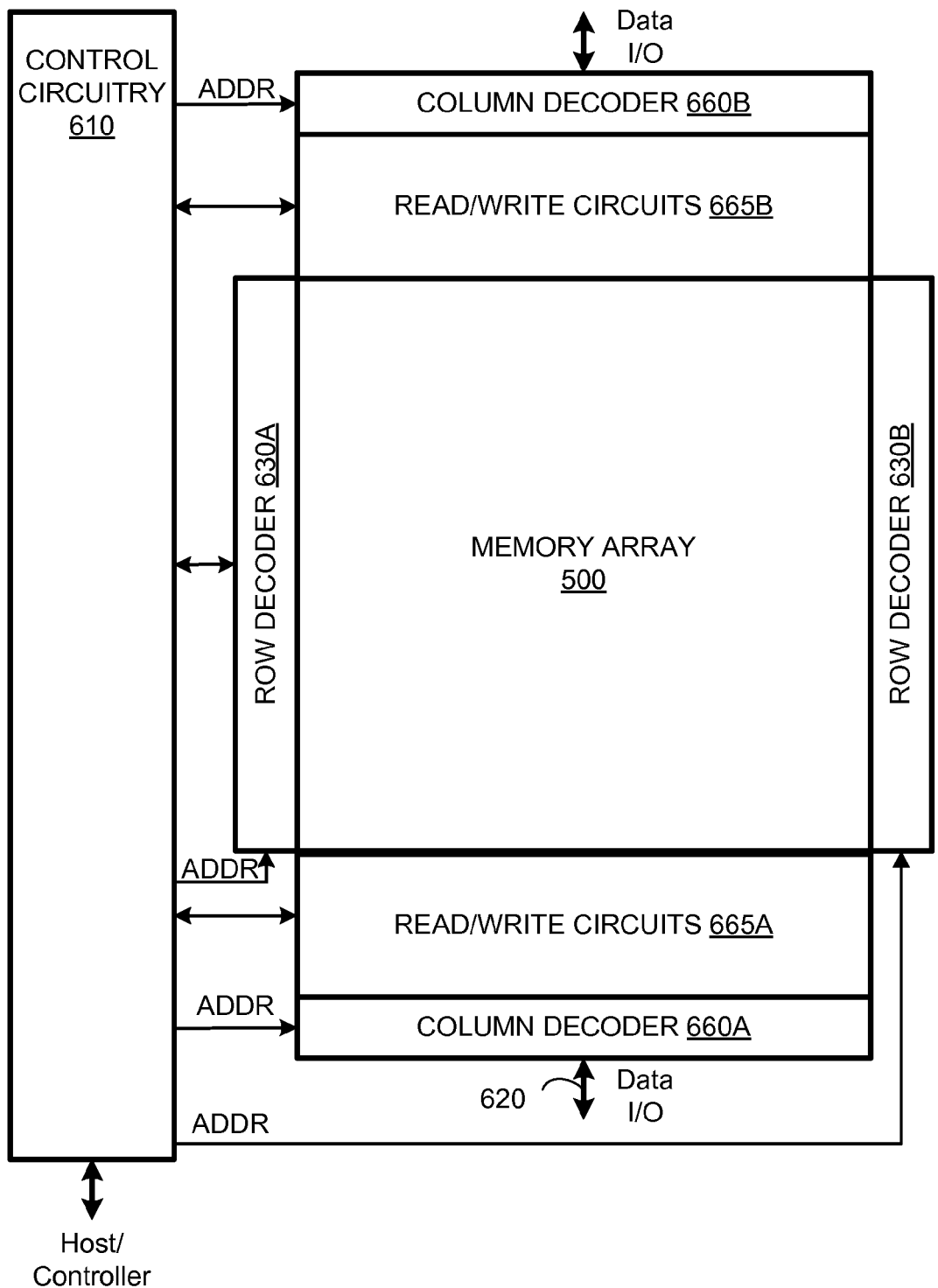
FIG. 20 is a block diagram of a non-volatile memory system using dual row/column decoders and read/write circuits.

FIG. 20 is a block diagram of a non-volatile memory system using dual row/column decoders and read/write circuits. Here, an alternative arrangement of the memory device 696 shown in FIG. 6 is provided. Access to the memory array 500 by the various peripheral circuits is implemented in a symmetric fashion, on opposite sides of the array, so that the densities of access lines and circuitry on each side are reduced by half. Thus, the row decoder is split into row decoders 630A and 630B and the column decoder into column decoders 660A and 660B. Similarly, the read/write circuits are split into read/write circuits 665A connecting to bit lines from the bottom and read/write circuits 665B connecting to bit lines from the top of the array 500. In this way, the density of the read/write modules is essentially reduced by one half. The device of FIG. 20 can also include a controller, as described above for the device of FIG. 6.

Figure 21:
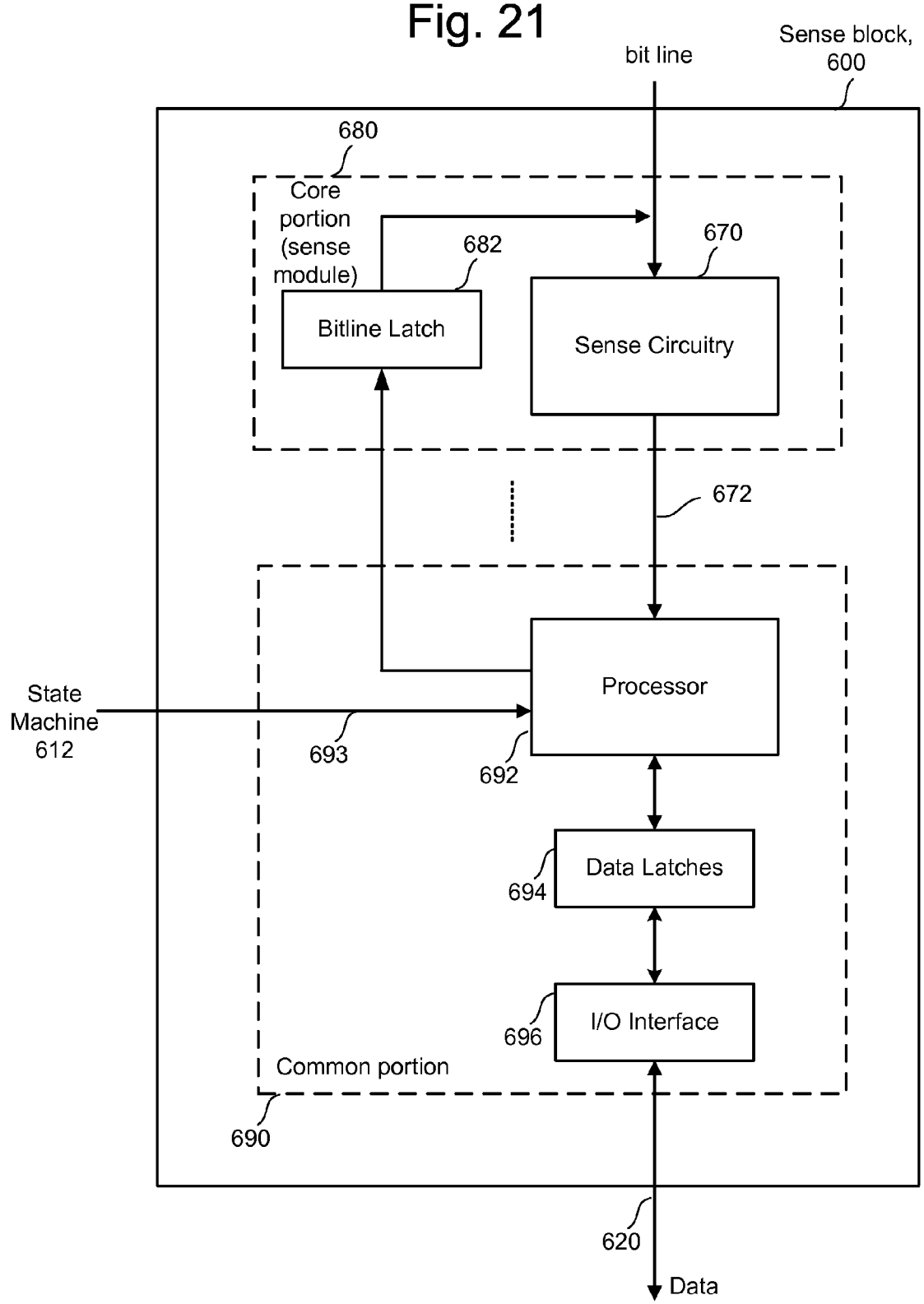
FIG. 21 is a block diagram depicting one embodiment of a sense block.

FIG. 21 is a block diagram depicting one embodiment of a sense block. An individual sense block 600, depicted in FIG. 6, is partitioned into a core portion, referred to as a sense module 680, and a common portion 690. In one embodiment, there will be a separate sense module 680 for each bit line and one common portion 690 for a set of multiple sense modules 680. In one example, a sense block will include one common portion 690 and eight sense modules 680. Each of the sense modules in a group will communicate with the associated common portion via a data bus 672. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 680 comprises sense circuitry 670 that determines whether a conduction current in a connected bit line is above or below a predetermined threshold level. Sense module 680 also includes a bit line latch 682 that is used to set a voltage condition on the connected bit line. For example, a predetermined state latched in bit line latch 682 will result in the connected bit line being pulled to a state designating program inhibit (e.g., $V_{dd}$).

Common portion 690 comprises a processor 692, a set of data latches 694 and an I/O Interface 696 coupled between the set of data latches 694 and data bus 620. Processor 692 performs computations. For example, one of its functions is to determine the data stored in the sensed storage element and store the determined data in the set of data latches. The set of data latches 694 is used to store data bits determined by processor 692 during a read operation. It is also used to store data bits imported from the data bus 620 during a program operation. The imported data bits represent write data meant to be programmed into the memory. I/O interface 696 provides an interface between data latches 694 and the data bus 620.

During read or sensing, the operation of the system is under the control of state machine 612 that controls the supply of different control gate voltages to the addressed storage element. As it steps through the various predefined control gate voltages corresponding to the various memory states supported by the memory, the sense module 680 may trip at one of these voltages and an output will be provided from sense module 680 to processor 692 via bus 672. At that point, processor 692 determines the resultant memory state by consideration of the tripping event(s) of the sense module and the information about the applied control gate voltage from the state machine via input lines 693. It then computes a binary encoding for the memory state and stores the resultant data bits into data latches 694. In another embodiment of the core portion, bit line latch 682 serves double duty, both as a latch for latching the output of the sense module 680 and also as a bit line latch as described above.

It is anticipated that some implementations will include multiple processors 692. In one embodiment, each processor 692 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 694 from the data bus 620. The program operation, under the control of the state machine, comprises a series of programming voltage pulses applied to the control gates of the addressed storage elements. Each programming pulse is followed by a read back (verify) to determine if the storage element has been programmed to the desired memory state. Processor 692 monitors the read back memory state relative to the desired memory state. When the two are in agreement, the processor 692 sets the bit line latch 682 so as to cause the bit line to be pulled to a state designating program inhibit. This inhibits the storage element coupled to the bit line from further programming even if programming pulses appear on its control gate. In other embodiments the processor initially loads the bit line latch 682 and the sense circuitry sets it to an inhibit value during the verify process.

Data latch stack 694 contains a stack of data latches corresponding to the sense module. In one embodiment, there are three data latches per sense module 680. In some implementations (but not required), the data latches are implemented as a shift register so that the parallel data stored therein is converted to serial data for data bus 620, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, issued Mar. 27, 2007, titled "Non-Volatile Memory And Method With Reduced Source Line Bias Errors"; (2) U.S. Pat. No. 7,023,736, issued Apr. 4, 2006, titled "Non-Volatile Memory And Method with Improved Sensing"; (3) U.S. Pat. No. 7,046,568, issued May 16, 2006, titled "Memory Sensing Circuit And Method For Low Voltage Operation"; (4) U.S. Patent Application Pub. 2006/0221692, published Oct. 5, 2006, titled "Compensating for Coupling During Read Operations of Non-Volatile Memory"; and (5) U.S. Patent Application Pub. No. 2006/0158947, published Jul. 20, 2006, titled "Reference Sense Amplifier For Non-Volatile Memory." All five of the immediately above-listed patent documents are incorporated herein by reference in their entirety.

Figure 22:
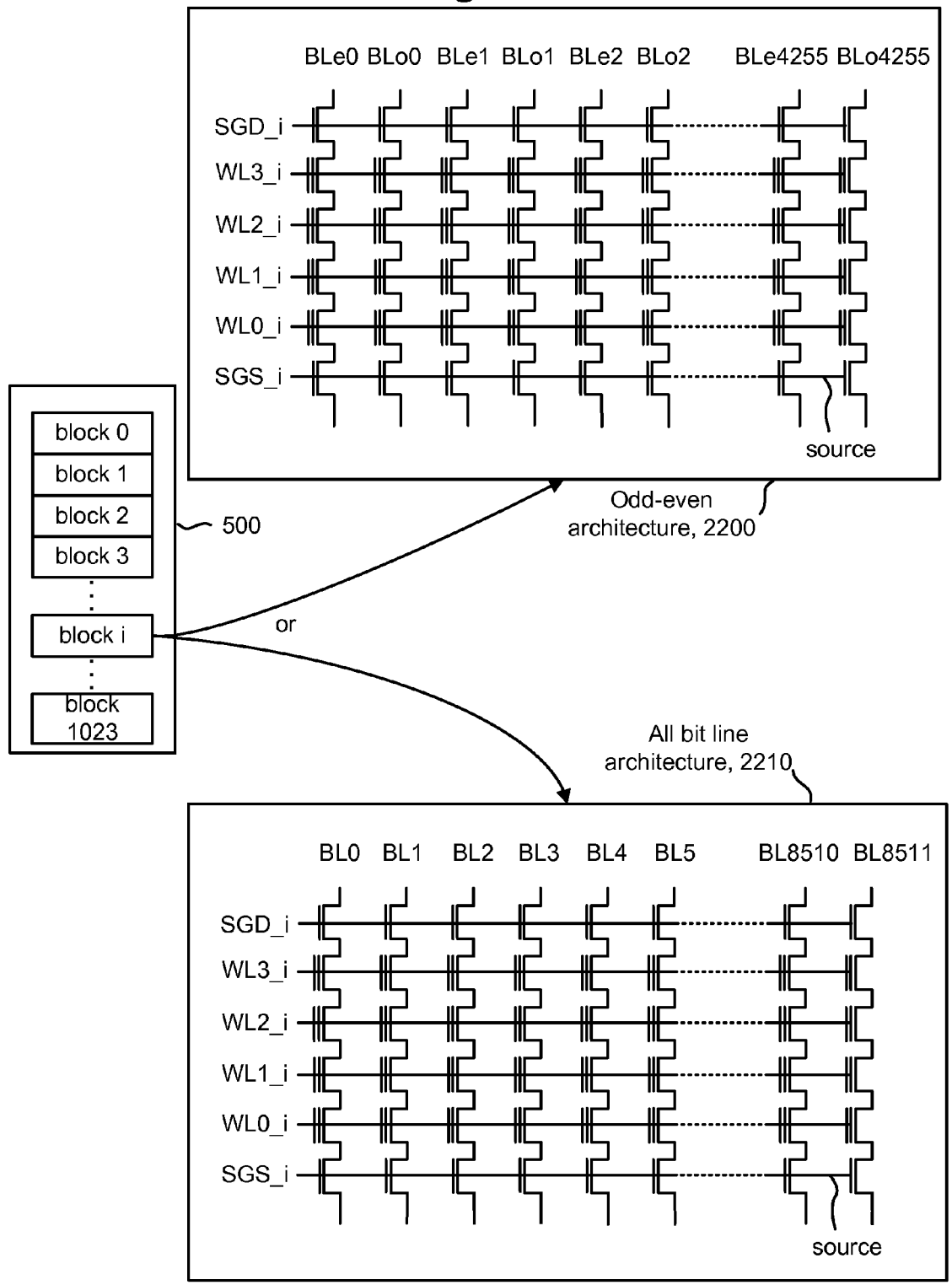
FIG. 22 illustrates an example of an organization of a memory array into blocks for an all bit line memory architecture or for an odd-even memory architecture.

FIG. 22 illustrates an example of an organization of a memory array into blocks for an all bit line memory architecture or for an odd-even memory architecture. Exemplary structures of memory array 2200 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 2210), all the bit lines of a block can be simultaneously selected during read and program operations. Storage elements along a common word line and connected to any bit line can be programmed at the same time.

In the example provided, 64 storage elements and two dummy storage elements are connected in series to form a NAND string. There are sixty four data word lines and two dummy word lines, WL-d0 and WL-d1, where each NAND string includes sixty four data storage elements and two dummy storage elements. In other embodiments, the NAND strings can have more or less than 64 data storage elements and two dummy storage elements. Data memory cells can store user or system data. Dummy memory cells are typically not used to store user or system data.

One terminal of the NAND string is connected to a corresponding bit line via a drain select gate (connected to select gate drain lines SGD), and another terminal is connected to c-source via a source select gate (connected to select gate source line SGS).

In one embodiment, referred to as an odd-even architecture (architecture 2200), the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. A lower $V_{READ}$ can be used for some word lines, as discussed. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 23:
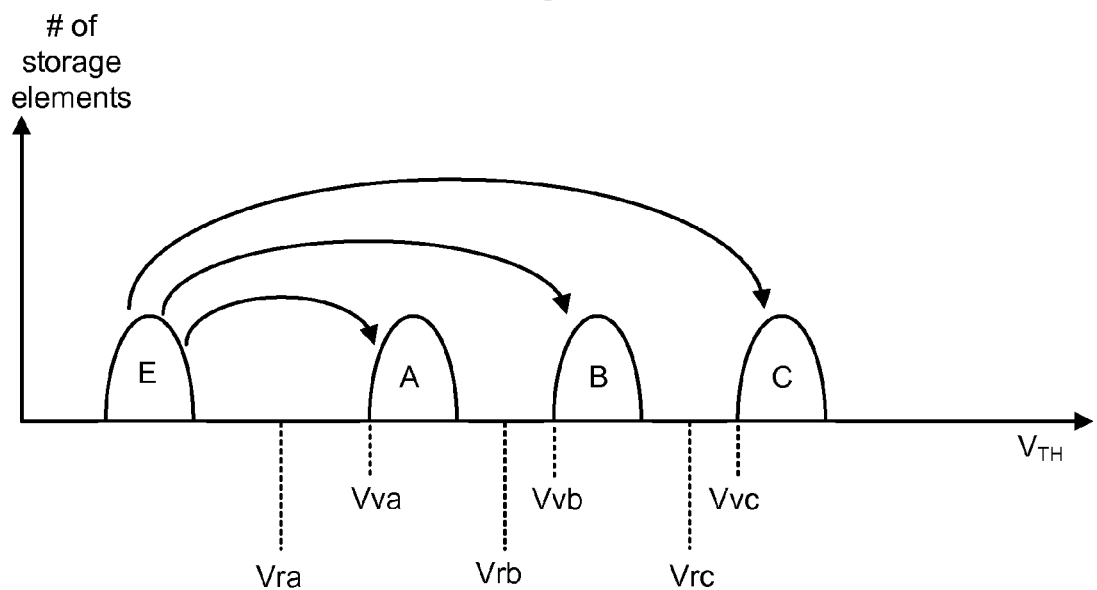
FIG. 23 depicts an example set of threshold voltage distributions with single pass programming.

FIG. 23 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or fewer than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. Additional read and reference values can be used when the storage elements store additional states. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses, as discussed previously, will then be used to program storage elements directly into states A, B or C. While some storage elements are being programmed from state E to state A, other storage elements are being programmed from state E to state B and/or from state E to state C. When programming from state E to state C on a selected word line, WLi, the amount of parasitic coupling to the adjacent floating gate under WLi-1 is a maximized since the change in amount of charge on the floating gate under WLi is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLi-1 will vary depending on the state of the adjacent storage element on WLi.

Figure 24:
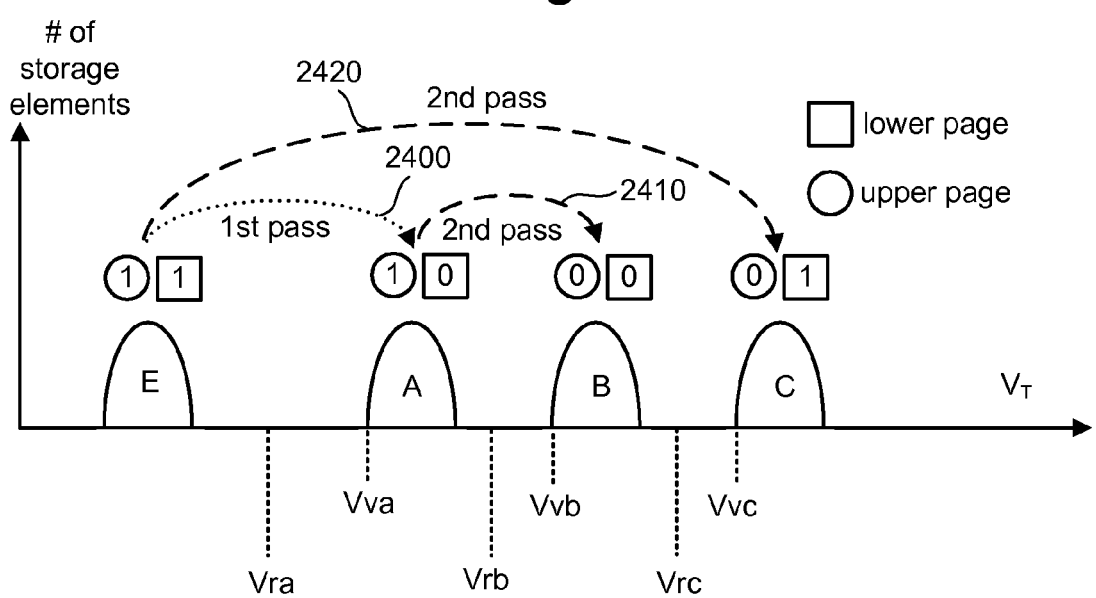
FIG. 24 depicts an example set of threshold voltage distributions with multi-pass programming.

FIG. 24 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2420. If the storage element had been programmed into state A as a result of the first programming pass, then the storage element is further programmed in the second pass so that the threshold voltage is increased to be within state B, as depicted by arrow 2410. The result of the second pass is to program the storage element into the state designated to store a logic "0" for the upper page without changing the data for the lower page. In both FIG. 23 and FIG. 24, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 25A:
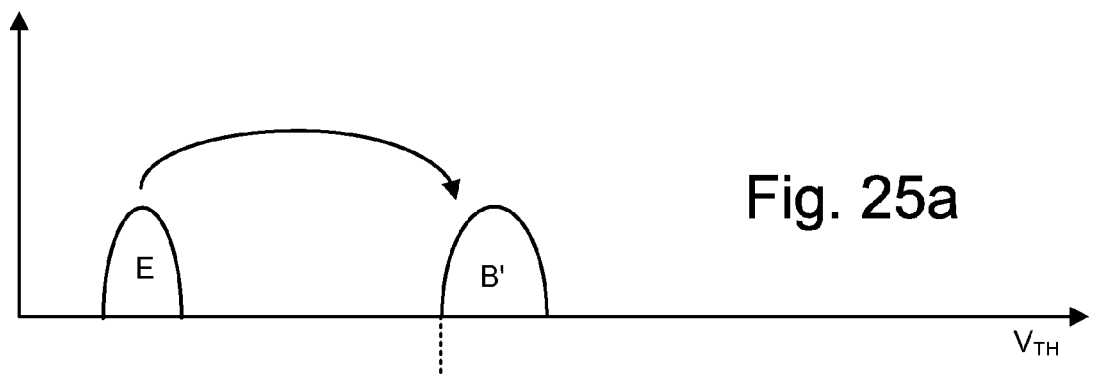
FIGS. 25a-c show various threshold voltage distributions and describe a process for programming non-volatile memory.
Figure 25B:
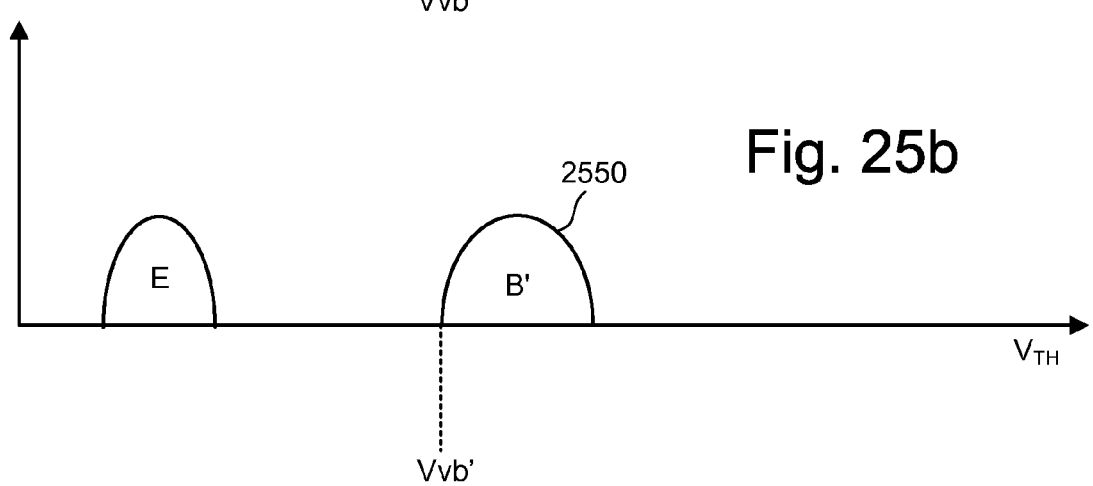
Figure 25C:
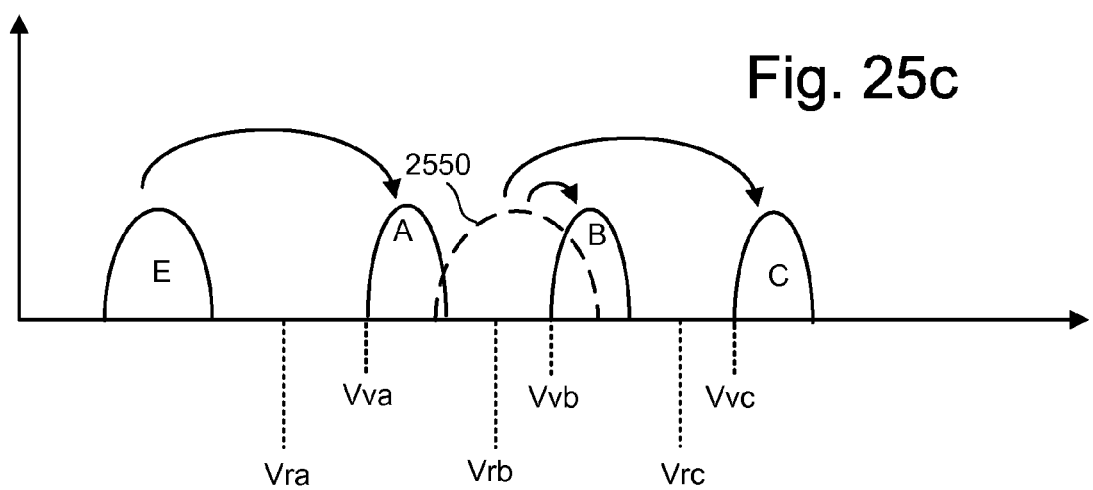

FIGS. 25a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 25a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 2550 of FIG. 25b. This apparent widening of the threshold voltage distribution will be remedied when programming the upper page.

FIG. 25c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2550 and the upper page data is to remain at 1, then the storage element will be programmed to final state B. If the storage element is in intermediate threshold voltage distribution 2550 and the upper page data is to become data 0, then the threshold voltage of the storage element will be raised so that the storage element is in state C. The process depicted by FIGS. 25a-c reduces the effect of floating gate to floating gate coupling because only the upper page programming of neighbor storage elements will have an effect on the apparent threshold voltage of a given storage element. An example of an alternate state coding is to move from distribution 2550 to state C when the upper page data is a 1, and to move to state B when the upper page data is a 0.

Although FIGS. 25a-c provide an example with respect to four data states and two pages of data, the concepts taught can be applied to other implementations with more or fewer than four states and different than two pages.

Figure 26:
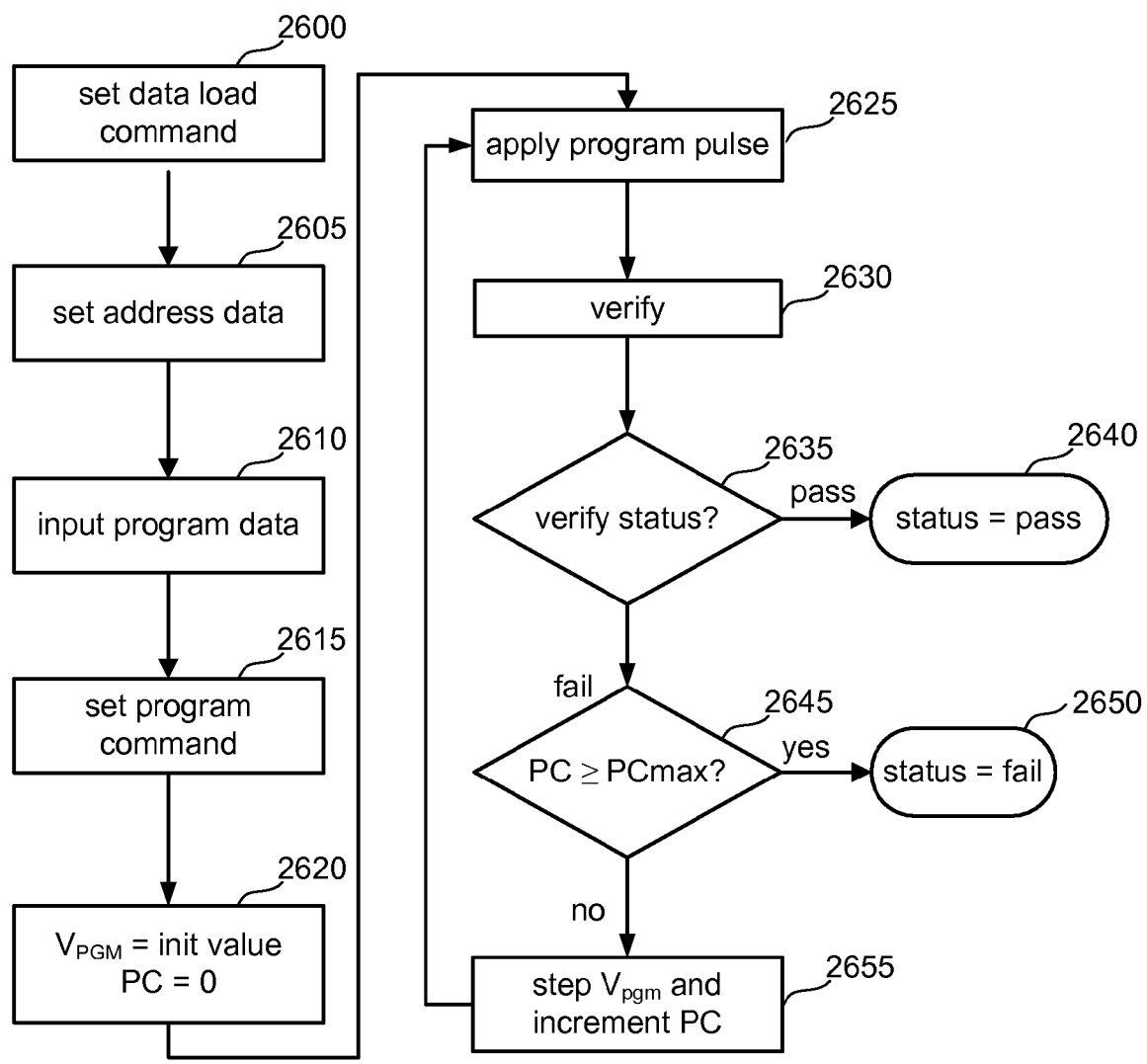
FIG. 26 is a flow chart describing one embodiment of a process for programming non-volatile memory.

FIG. 26 is a flow chart describing one embodiment of a method for programming non-volatile memory. In one implementation, storage elements are erased (in blocks or other units) prior to programming. In step 2600, a "data load" command is issued by the controller and input received by control circuitry 610. In step 2605, address data designating the page address is input to decoder 614 from the controller or host. In step 2610, a page of program data for the addressed page is input to a data buffer for programming. That data is latched in the appropriate set of latches. In step 2615, a "program" command is issued by the controller to state machine 612.

Triggered by the "program" command, the data latched in step 2610 will be programmed into the selected storage elements controlled by state machine 612 using the stepped program pulses applied to the appropriate selected word line. In step 2620, the program voltage, $V_{PGM}$, is initialized to the starting pulse (e.g., 12 V or other value) and a program counter (PC) maintained by state machine 612 is initialized at zero. In step 2625, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{dd}$ to inhibit programming.

In step 2630, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 2635 (verify status), a check is made as to whether all of the data latches are storing logic "1." If all of the data latches are storing logic "1," the programming process is complete and successful because all selected storage elements were programmed and verified. In this case, a status of "PASS" is reported in step 2640.

If, in step 2635, it is determined that not all of the data latches are storing logic "1," then the programming process continues. In step 2645, the program counter PC is checked against a program limit value PCmax. One example of a program limit value is twenty; however, other numbers can also be used. If the program counter PC is not less than PCmax, then the program process has failed and a status of "FAIL" is reported in step 2650. If the program counter PC is less than PCmax, then $V_{PGM}$ is increased by the step size, or otherwise set as discussed herein, and the program counter PC is incremented in step 2655. The process then loops back to step 2625 to apply the next $V_{PGM}$ pulse.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage system, comprising:
    providing a series of program voltage pulses to at least one non-volatile storage element in a set of non-volatile storage elements, a digital-to-analog converter is used to provide the series of program voltage pulses in response to code words which are input to the digital-to-analog converter according to a code word sequence; and
    determining when a particular code word which has a threshold number of rollover bits is reached in the code word sequence.

2. The method of claim 1, further comprising:
    in response to the determining, repeating a program voltage pulse having a magnitude associated with a prior code word, the prior code word is before the particular code word in the code word sequence.

3. The method of claim 2, wherein:
    the prior code word is immediately prior to the particular code word in the code word sequence.

4. The method of claim 2, wherein:
    the prior code word is not immediately prior to the particular code word in the code word sequence.

5. The method of claim 1, further comprising:
    in response to the determining, repeating, a plurality of times, a program voltage pulse having a magnitude associated with a prior code word, the prior code word is before the particular code word in the code word sequence.

6. The method of claim 1, further comprising:
    in response to the determining, extending a duration of a program voltage pulse which is provided by the digital-to-analog converter in response to the particular code word, relative to an average duration of other program voltage pulses in the series.

7. The method of claim 1, further comprising:
    in response to the determining, shortening a duration of a program voltage pulse which is provided by the digital-to-analog converter in response to the particular code word, relative to an average duration of other program voltage pulses in the series.

8. The method of claim 1, further comprising:
    determining when a code word which is adjacent to the particular code word is reached in the code word sequence; and
    extending or shortening a duration of a program voltage pulse which is provided by the digital-to-analog converter in response to the code word which is adjacent to the particular code word, relative to an average duration of other program voltage pulses in the series.

9. The method of claim 1, wherein:
    magnitudes of program voltage pulses in the series increase step-wise at a minimum resolution of the digital-to-analog converter in accordance with the code word sequence.

10. The method of claim 1, further comprising:
    in response to the determining, initiating a corrective action to adjust for a nonlinearity in the digital-to-analog converter.

11. A method for operating a non-volatile storage system, comprising:
    observing a correspondence between voltages provided by a digital-to-analog converter and code words input to the digital-to-analog converter;
    determining at least one code word for which the correspondence is non-linear;
    providing a series of program voltage pulses to at least one storage element in a set of non-volatile storage elements using the digital-to-analog converter, the digital-to-analog converter is used to provide the series of program voltage pulses in response to the code words, which are input to the digital-to-analog converter in a code word sequence; and
    determining when the at least one code word is reached in the code word sequence.

12. The method of claim 11, further comprising:
    compensating for the non-linear correspondence when the at least one code word is reached in the code word sequence.

13. The method of claim 12, wherein:
the compensating includes inputting a different code word to the digital-to-analog converter, at least once, in place of the at least one code word.

14. The method of claim 12, wherein:
the compensating includes adjusting, relative to other program voltage pulses in the series, a program voltage pulse which is provided by the digital-to-analog converter in response to the at least one code word being input to the digital-to-analog converter.

15. The method of claim 11, wherein:
magnitudes of program voltage pulses in the series increase step-wise at a minimum resolution of the digital-to-analog converter in accordance with the code word sequence.

16. A method for operating a non-volatile storage system, comprising:
determining a differential non-linearity of a digital-to-analog converter;
providing a series of program voltage pulses to at least one non-volatile storage element in a set of non-volatile storage elements using the digital-to-analog converter; and
adjusting, relative to other program voltage pulses in the series, at least one of the program voltage pulses which is associated with the differential non-linearity.

17. The method of claim 16, wherein:
the adjusting comprises varying a duration of the at least one of the program voltage pulses relative to an average duration of other program voltage pulses in the series.

18. The method of claim 16, wherein:
the adjusting comprises extending a duration of the at least one of the program voltage pulses relative to an average duration of other program voltage pulses in the series, and shortening a duration of another program voltage pulse relative to the average duration.

19. The method of claim 16, wherein:
the adjusting comprises shortening a duration of the at least one of the program voltage pulses relative to an average duration of other program voltage pulses in the series, and extending a duration of another program voltage pulse relative to the average duration.

20. The method of claim 16, wherein:
the differential non-linearity is associated with at least one code word which comprises a threshold number of rollover bits, the at least one code word is input to the digital-to-analog converter.

21. A method for operating a non-volatile storage system, comprising:
observing a correspondence between voltages provided by a digital-to-analog converter and code words input to the digital-to-analog converter;
determining at least one code word for which the correspondence is non-linear;
providing a series of program voltage pulses to at least one non-volatile storage element in a set of non-volatile storage elements using the digital-to-analog converter; and
adjusting a programming speed of the at least one non-volatile storage element when the at least one code word is input to the digital-to-analog converter.

22. The method of claim 21, wherein:
the series of program voltage pulses are provided to the at least one non-volatile storage element via a selected word line, and a pass voltage is provided to at least one other non-volatile storage element in the set of non-volatile storage elements via at least one unselected word line;
the adjusting comprises adjusting a level of the pass voltage.

23. The method of claim 21, wherein:
the adjusting comprises adjusting a level of a voltage on a bit line which is associated with the at least one non-volatile storage element.

24. The method of claim 21, wherein:
the adjusting comprises adjusting a body bias associated with the at least one non-volatile storage element.

25. A non-volatile storage system, comprising:
a set of non-volatile storage elements;
a digital-to-analog converter which provide a series of program voltage pulses to at least one non-volatile storage element in the set of non-volatile storage elements in response to code words which are input to the digital-to-analog converter according to a code word sequence; and
at least one control circuit in communication with the set of non-volatile storage elements and the digital-to-analog converter, the at least one control circuit determines when a particular code word which has a threshold number of rollover bits is reached in the code word sequence.

26. The non-volatile storage system of claim 25, wherein:
in response to determining when the particular code word which has the threshold number of rollover bits is reached in the code word sequence, the at least one control circuit instructs the digital-to-analog converter to repeat a program voltage pulse having a magnitude associated with a prior code word, the prior code word is before the particular code word in the code word sequence.

27. The non-volatile storage system of claim 26, wherein:
the prior code word is immediately prior to the particular code word in the code word sequence.

28. The non-volatile storage system of claim 26, wherein:
the prior code word is not immediately prior to the particular code word in the code word sequence.

29. The non-volatile storage system of claim 25, wherein:
in response to determining when the particular code word which has the threshold number of rollover bits is reached in the code word sequence, the at least one control circuit instructs the digital-to-analog converter to repeat, a plurality of times, a program voltage pulse having a magnitude associated with a prior code word, the prior code word is before the particular code word in the code word sequence.

30. The non-volatile storage system of claim 25, wherein:
in response to determining when the particular code word which has the threshold number of rollover bits is reached in the code word sequence, the at least one control circuit instructs the digital-to-analog converter to extend a duration of a program voltage pulse which is provided by the digital-to-analog converter in response to the particular code word, relative to an average duration of other program voltage pulses in the series.

31. The non-volatile storage system of claim 25, wherein:
in response to determining when the particular code word which has the threshold number of rollover bits is reached in the code word sequence, the at least one control circuit instructs the digital-to-analog converter to shorten a duration of a program voltage pulse which is provided by the digital-to-analog converter in response to the particular code word, relative to an average duration of other program voltage pulses in the series.

32. The non-volatile storage system of claim 25, wherein:
the at least one control circuit determines when a code word which is adjacent to the particular code word is reached in the code word sequence; and
in response to the at least one control circuit determining when the code word which is adjacent to the particular code word is reached in the code word sequence, the at least one control circuit instructs the digital-to-analog converter to extend or shorten a duration of a program voltage pulse which is provided by the digital-to-analog converter in response to the code word which is adjacent to the particular code word, relative to an average duration of other program voltage pulses in the series.

33. The non-volatile storage system of claim 25, wherein:
magnitudes of program voltage pulses in the series increase step-wise at a minimum resolution of the digital-to-analog converter in accordance with the code word sequence.

34. The non-volatile storage system of claim 25, wherein:
in response to determining when the particular code word which has the threshold number of rollover bits is reached in the code word sequence, the at least one control circuit initiates a corrective action to adjust for a nonlinearity in the digital-to-analog converter.

35. A non-volatile storage system, comprising:
a set of non-volatile storage elements;
a digital-to-analog converter; and
at least one control circuit in communication with the set of non-volatile storage elements and the digital-to-analog converter, the at least one control circuit: a) observes a correspondence between voltages provided by the digital-to-analog converter and code words input to the digital-to-analog converter, b) determines at least one code word for which the correspondence is non-linear, c) provides a series of program voltage pulses to at least one storage element in the set of non-volatile storage elements using the digital-to-analog converter, the digital-to-analog converter is used to provide the series of program voltage pulses in response to the code words, which are input to the digital-to-analog converter in a code word sequence, and d) determines when the at least one code word is reached in the code word sequence.

36. The non-volatile storage system of claim 35, wherein:
the at least one control circuit compensates for the non-linear correspondence when the at least one code word is reached in the code word sequence.

37. The non-volatile storage system of claim 36, wherein:
the at least one control circuit compensates for the non-linear correspondence by inputting a different code word to the digital-to-analog converter, at least once, in place of the at least one code word.

38. The non-volatile storage system of claim 36, wherein:
the at least one control circuit compensates for the non-linear correspondence by adjusting, relative to other program voltage pulses in the series, a program voltage pulse which is provided by the digital-to-analog converter in response to the at least one code word being input to the digital-to-analog converter.

39. The non-volatile storage system of claim 35, wherein:
magnitudes of program voltage pulses in the series increase step-wise at a minimum resolution of the digital-to-analog converter in accordance with the code word sequence.

40. A non-volatile storage system, comprising:
a set of non-volatile storage elements;
a digital-to-analog converter; and
at least one control circuit in communication with the set of non-volatile storage elements and the digital-to-analog converter, the at least one control circuit determines a differential non-linearity of the digital-to-analog converter, provides a series of program voltage pulses to at least one non-volatile storage element in the set of non-volatile storage elements using the digital-to-analog converter, and adjusts, relative to other program voltage pulses in the series, at least one of the program voltage pulses which is associated with the differential non-linearity.

41. The non-volatile storage system of claim 40, wherein:
the at least one control circuit adjusts the at least one of the program voltage pulses by varying a duration of the at least one of the program voltage pulses relative to an average duration of other program voltage pulses in the series.

42. The non-volatile storage system of claim 40, wherein:
the at least one control circuit adjusts the at least one of the program voltage pulses by extending a duration of the at least one of the program voltage pulses relative to an average duration of other program voltage pulses in the series, and shortening a duration of another program voltage pulse relative to the average duration.

43. The non-volatile storage system of claim 40, wherein:
the at least one control circuit adjusts the at least one of the program voltage pulses by shortening a duration of the at least one of the program voltage pulses relative to an average duration of other program voltage pulses in the series, and extending a duration of another program voltage pulse relative to the average duration.

44. The non-volatile storage system of claim 40, wherein:
the differential non-linearity is associated with at least one code word which comprises a threshold number of rollover bits, the at least one code word is input to the digital-to-analog converter.

45. A non-volatile storage system, comprising:
a set of non-volatile storage elements;
a digital-to-analog converter; and
at least one control circuit in communication with the set of non-volatile storage elements and the digital-to-analog converter, the at least one control circuit: a) observes a correspondence between voltages provided by a digital-to-analog converter and code words input to the digital-to-analog converter, b) determines at least one code word for which the correspondence is non-linear, c) provides a series of program voltage pulses to at least one non-volatile storage element in a set of non-volatile storage elements using the digital-to-analog converter, and d) adjusts a programming speed of the at least one non-volatile storage element when the at least one code word is input to the digital-to-analog converter.

46. The non-volatile storage system of claim 45, wherein:
the at least one control circuit provides the series of program voltage pulses to the at least one non-volatile storage element via a selected word line, and provides a pass voltage to at least one other non-volatile storage element in the set of non-volatile storage elements via at least one unselected word line; and
the at least one control circuit adjusts the programming speed of the at least one non-volatile storage element by adjusting a level of the pass voltage.

47. The non-volatile storage system of claim 45, wherein:
the at least one control circuit adjusts the programming speed of the at least one non-volatile storage element by adjusting a level of a voltage on a bit line which is associated with the at least one non-volatile storage element.

48. The non-volatile storage system of claim 45, wherein:
the at least one control circuit adjusts the programming speed of the at least one non-volatile storage element by adjusting a body bias associated with the at least one non-volatile storage element.

* * * * *